US010074551B2

(12) United States Patent
Minato et al.

(10) Patent No.: US 10,074,551 B2
(45) Date of Patent: Sep. 11, 2018

(54) POSITION DETECTION APPARATUS, POSITION DETECTION METHOD, INFORMATION PROCESSING PROGRAM, AND STORAGE MEDIUM

(71) Applicant: OMRON Corporation, Kyoto-shi, Kyoto (JP)

(72) Inventors: Yoshihisa Minato, Kyoto (JP); Kosuke Hattori, Kusatsu (JP); Yutaka Kiuchi, Kusatsu (JP); Yuki Akatsuka, Kyoto (JP)

(73) Assignee: OMRON Corporation, Kyoto-shi (JP)

(*) Notice: Subject to any disclaimer, the term of this patent is extended or adjusted under 35 U.S.C. 154(b) by 90 days.

(21) Appl. No.: 15/278,623

(22) Filed: Sep. 28, 2016

(65) Prior Publication Data
US 2017/0125271 A1 May 4, 2017

(30) Foreign Application Priority Data

Oct. 28, 2015 (JP) .................. 2015-212123

(51) Int. Cl.
G06K 9/00 (2006.01)
H01L 21/67 (2006.01)
G06T 7/00 (2017.01)
H01L 21/68 (2006.01)

(52) U.S. Cl.
CPC ...... *H01L 21/67259* (2013.01); *G06T 7/0004* (2013.01); *G06T 7/0042* (2013.01); *H01L 21/681* (2013.01); *H01L 21/682* (2013.01); *G06T 2207/10004* (2013.01); *G06T 2207/30148* (2013.01)

(58) Field of Classification Search
USPC ........................................ 382/144
See application file for complete search history.

(56) References Cited

U.S. PATENT DOCUMENTS

| 2002/0061125 A1* | 5/2002 | Fujii ............... G06K 9/00067 382/125 |
| 2006/0100740 A1* | 5/2006 | Sakiya ................ B25J 9/1692 700/246 |
| 2006/0190174 A1* | 8/2006 | Li ..................... G01C 17/38 701/530 |
| 2013/0089754 A1* | 4/2013 | Nishimori ........... G11B 5/7315 428/846.9 |

FOREIGN PATENT DOCUMENTS

JP 2011-249572 A 12/2011

* cited by examiner

*Primary Examiner* — Jerome Grant, II
(74) *Attorney, Agent, or Firm* — Metrolexis Law Group, PLLC

(57) ABSTRACT

A hypothesis testing position detection apparatus improves robustness against abnormal detection values, and achieves both high accuracy estimation and high-speed estimation processing. An image processing apparatus extracts, from calculated values for a central position of a plane shape, one of the calculated values nearer a provisional center as a candidate for evaluation (testing) performed using a plurality of detection points.

13 Claims, 8 Drawing Sheets

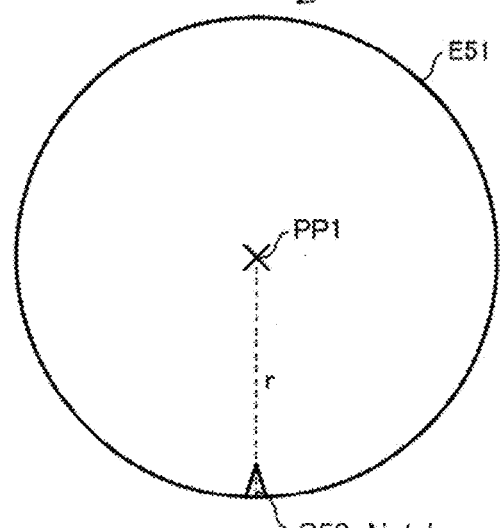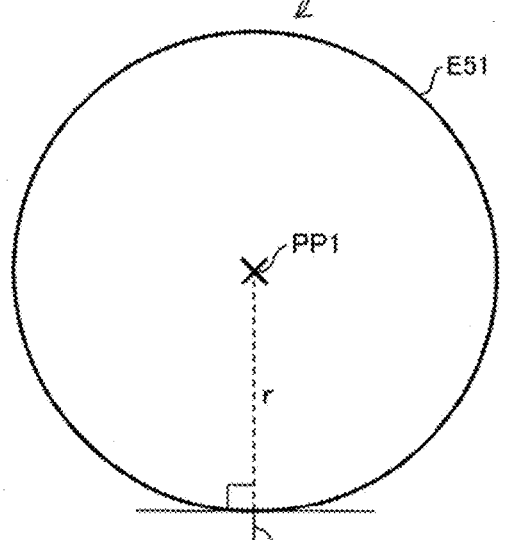

ions filed Oct. 28, 2015, the entire
POSITION DETECTION APPARATUS, POSITION DETECTION METHOD, INFORMATION PROCESSING PROGRAM, AND STORAGE MEDIUM

CROSS-REFERENCES TO RELATED APPLICATIONS

This application claims priority to Japanese Patent Application No. 2015-212123 filed Oct. 28, 2015, the entire contents of which are incorporated herein by reference.

FIELD

This disclosure relates to a position detection apparatus that detects the position of an object to be processed such as a semiconductor wafer.

BACKGROUND

Manufacturing processes such as fabrication of semiconductor wafers use the basic technique of positioning objects to be processed or to be inspected. Hypothesis testing fitting has been used to estimate a parameter associated with, for example, the position of an object such as the center of the object shape with high accuracy.

For example, Patent Literature 1 below describes a hypothesis testing fitting technique for calculating the central position of a wafer based on the outline of the wafer. This technique prevents the central position of the wafer from being calculated erroneously by erroneously detecting the position of the outline of the wafer.

With this technique, the coordinates of at least four points on the wafer outline are detected (at least four detection points are obtained), and all combinations of three points (three selection points) are determined from the coordinate values of the plurality of detected points on the outline (or edge), and the coordinates of the central position (the central position as the calculated value) are calculated for each combination of three points. The variation in the calculated coordinates of the central positions is then calculated. When the variation does not exceed a predetermined threshold, the edge detection is determined successful. This technique prevents the central position of a wafer from being calculated erroneously by erroneous detection through image processing.

CITATION LIST

Patent Literature

Patent Literature 1: Japanese Unexamined Patent Application Publication No. 2011-249572 (published on Dec. 8, 2011)

SUMMARY

Technical Problem

However, the above technique known in the art takes a longer time for testing when more detection points are used to obtain more calculated values (hypotheses), and lowers the accuracy of estimation when fewer detection points are used to obtain fewer calculated values that are used as candidates for testing (candidates for evaluation).

Further, the above technique known in the art can have large variations in the estimation results obtained based on a plurality of hypotheses (calculated central positions) when the detection points include an abnormal detection point. This can stop the processing. To lower the likelihood of the processing being stopped, the technique may allow certain degrees of variations (estimated values with low accuracy). The technique known in the art that averages all the hypotheses can lower the accuracy of the final output.

In response to the above issue, one or more aspects of the present invention are directed to a hypothesis testing position detection apparatus that has high robustness against abnormal detection points caused by measurement errors and the surrounding noise and achieves both high accuracy estimation and high-speed estimation processing, a position detection system, a method for controlling a position detection apparatus, and a program.

Solution to Problem

In response to the above issue, a position detection apparatus according to one aspect of the present invention includes a calculation unit, an extraction unit, and a determination unit. The calculation unit calculates a plurality of values for a parameter defining a two-dimensional or three-dimensional shape using one or more combinations of selection points selected from a plurality of detection points associated with the shape. The extraction unit extracts, from the plurality of values calculated by the calculation unit, one or more calculated values whose relevance to a provisional parameter falls within a predetermined range. The provisional parameter is a value or a range of values estimated for the parameter defining the shape with a method different from a calculation method with which the calculation unit calculates the values. The determination unit determines, from the one or more calculated values extracted by the extraction unit, a value with the highest evaluation performed using the plurality of detection points as an estimated value for the parameter defining the shape.

The position detection apparatus with the above structure evaluates (tests), using the detection points, one or more calculated values whose relevance to the provisional parameter falls within the predetermined range extracted from the plurality of values calculated using each combination of selection points. The position detection apparatus can thus output the best-possible result that can be estimated from the group of detection points by eliminating the effect of hypotheses with low accuracy. The position detection apparatus achieves high accuracy estimation as when evaluating all the values calculated using each combination of selection points, and achieves higher-speed evaluation processing than the evaluation processing performed using all the calculated values. In other words, the position detection apparatus has high robustness against abnormal detection points caused by measurement errors and the surrounding noise, and achieves both high accuracy estimation and high-speed estimation processing.

In the position detection apparatus in some embodiments, the shape includes a captured image of an object for which the parameter is to be determined by the position detection apparatus and/or a measurement value for the object.

The position detection apparatus with the above structure obtains the captured image of the object and/or the measurement value as image data or as data, and estimates the parameter defining the shape included in the obtained image data or the obtained data (e.g., the parameter associated with the position of the shape) to determine the parameter defining the object (e.g., the parameter associated with the position of the object).

In the position detection apparatus in some embodiments, the determination unit determines, from the one or more calculated values extracted by the extraction unit, the estimated value using the number of detection points located within a predetermined distance from the shape estimated using the calculated values and/or a sum of distances from the shape estimated using the calculated values to each of the detection points.

The position detection apparatus with the above structure determines the estimated value from the above calculated values, or specifically, for example, determines, as the estimated value, a calculated value with the largest number of detection points located within the predetermined distance from the shape (e.g., the outline of the shape) estimated using the calculated values, or determines, as the estimated value, a calculated value with the smallest sum of distances from the shape (e.g., the outline of the shape) estimated using the calculated values to each of the detection points.

In some embodiments, the position detection apparatus further includes a setting unit that sets, as the provisional parameter, a value or a range of values estimated using an area designated by a user as an area including an outline of the shape, and/or a value or a range of values designated by the user as the parameter defining the shape.

The position detection apparatus with the above structure sets, as the provisional parameter, the value or the range of values estimated using the area designated by the user as the area including the outline of the shape, and/or the value or the range of values designated by the user as the parameter defining the shape (e.g., the parameter associated with the position of the shape). For example, the position detection apparatus narrows down the calculated values as candidates for evaluation (testing) performed using the detection points based on the provisional parameter set by using the area that is intuitively designated by the user as the area including the outline the shape. The position detection apparatus thus incorporates intuitive processing performed by the user into the automatic (or specifically geometric or algebraic) processing for evaluating the calculated values. The position detection apparatus thus has high robustness against abnormal detection points caused by measurement errors and the surrounding noise, and achieves both high accuracy estimation and high-speed estimation processing.

In the position detection apparatus in some embodiments, when the calculation unit calculates the plurality of values using one of the combinations of selection points, the extraction unit extracts, from the plurality of calculated values, one calculated value whose relevance to the provisional parameter falls within the predetermined range.

When a plurality of calculated values are calculated using one combination of selected points, the position detection apparatus with the above structure extracts one best-possible calculated value from the plurality of calculated values. The position detection apparatus can thus output the best-possible result that can be estimated from the group of detection points by eliminating the effect of hypotheses with low accuracy.

In the position detection apparatus in some embodiments, the parameter defining the shape is a central position of a substantially circular shape. The calculation unit calculates, for one or more combinations of two selection points on an outline of the substantially circular shape, intersections of two circles with a predetermined radius and each having one of the two selection points as a center as a calculated value for the central position. When the calculation unit obtains two intersections using the two selection points, the extraction unit extracts, from the two intersections, an intersection with the shorter distance to a provisional central position set as a provisional parameter of the central position, or an intersection included in a provisional central area set as the provisional parameter of the central position, as the calculated value for the central position corresponding to the two selection points.

When two calculated values (the two intersections) are calculated using the two selection points, the position detection apparatus with the above structure extracts one of the calculated values based on the provisional central position or the provisional central area, and set the extracted calculated value as a candidate for evaluation (testing) performed using the detection points. When, for example, the number of detection points is N, $_NC_2$ combinations are available for selecting two selection points from the N detection points. When two calculated values are calculated using each of the $_NC_2$ combinations without extraction based on the provisional central position or the provisional central area, the $2*_NC_2$ calculated values undergo evaluation (testing) performed using the N detection points. In contrast, the position detection apparatus extracts calculated values based on the provisional central position or the provisional central area, and thus evaluates the half of the calculated values to be evaluated without the extraction, or specifically evaluates the $_NC_2$ calculated values, to determine the central position of the substantially circular shape. In other words, the position detection apparatus extracts a calculated value as the candidate for evaluation based on the provisional central position or the provisional central area. The position detection apparatus thus has high robustness against abnormal detection points caused by measurement errors and the surrounding noise, and achieves both high accuracy estimation and high-speed estimation processing.

In response to the above issue, a position detection method according to another aspect of the present invention includes a calculation process, an extraction process, and a determination process. The calculation process includes calculating a plurality of values for a parameter defining a two-dimensional or three-dimensional shape using one or more combinations of selection points selected from a plurality of detection points associated with the shape. The extraction process includes extracting, from the plurality of values calculated in the calculation process, one or more calculated values whose relevance to a provisional parameter falls within a predetermined range. The provisional parameter is a value or a range of values estimated for the parameter defining the shape with a method different from a calculation method used in the calculation process. The determination process includes determining, from the one or more calculated values extracted in the extraction process, a value with the highest evaluation performed using the plurality of detection points as an estimated value for the parameter defining the shape.

The above position detection method allows evaluation (testing) of, using the detection points, one or more calculated values whose relevance to the provisional parameter falls within the predetermined range extracted from the plurality of values calculated using each combination of selection points. The position detection method thus allows output of the best-possible result that can be estimated from the group of detection points by eliminating the effect of hypotheses with low accuracy. The position detection method achieves high accuracy estimation as when evaluating all the values calculated using each combination of selection points, and achieves higher-speed evaluation processing than the evaluation processing performed using all the calculated values. In other words, the position detection method has high robustness against abnormal detection points caused by measurement errors and the surrounding noise, and achieves both high accuracy estimation and high-speed estimation processing.

Advantageous Effects

The hypothesis testing position detection apparatus and other aspects of the present invention have high robustness against abnormal detection points caused by measurement errors and the surrounding noise, and achieve both high accuracy estimation and high-speed estimation processing.

BRIEF DESCRIPTION OF THE DRAWINGS

FIGS. 5A and 5B are diagrams each describing an example method for setting a provisional center other than the method described with reference to FIG. 4, with FIG. 5A showing an example in which the provisional center is set using a notch on the edge of the (substantially) circular shape, and FIG. 5B showing an example in which the provisional center is set using an edge normal of the (substantially) circular shape.

DETAILED DESCRIPTION

First Embodiment

A first embodiment of the present invention will now be described in detail with reference to FIGS. 1 to 6. An image processing apparatus 10 according to the first embodiment estimates a parameter associated with the position of a two-dimensional (2D) shape I50. However, the image processing apparatus 10 may not estimate the parameter associated with the position of the plane shape I50, but may estimate any typical parameters defining the plane shape I50 including a parameter associated with an edge of the plane shape I50 as described in a second embodiment (described later).

The image processing apparatus 10 may not process a plane shape (two-dimensional shape). The image processing apparatus 10 may estimate a parameter defining a solid shape (three-dimensional shape). In other words, the image processing apparatus 10 may estimate a parameter defining a solid shape with the same method as the method for processing the plane shape I50 described below.

The image processing apparatus 10 may not process the plane shape I50 obtained as image data. The image processing apparatus 10 may process, for example, data representing a measurement value for an object (an object for which a parameter defining the shape is to be determined).

For easier understanding of the image processing apparatus 10 (position detection apparatus) according to one embodiment of the present invention, a position detection system 1 will now be described briefly. The term "outline" refers to an edge, which is not limited to the outermost edge of a shape. In other words, the term "outline" herein does exclude use of its intrinsic or inherent information.

Overview of Position Detection System

Figure 1:
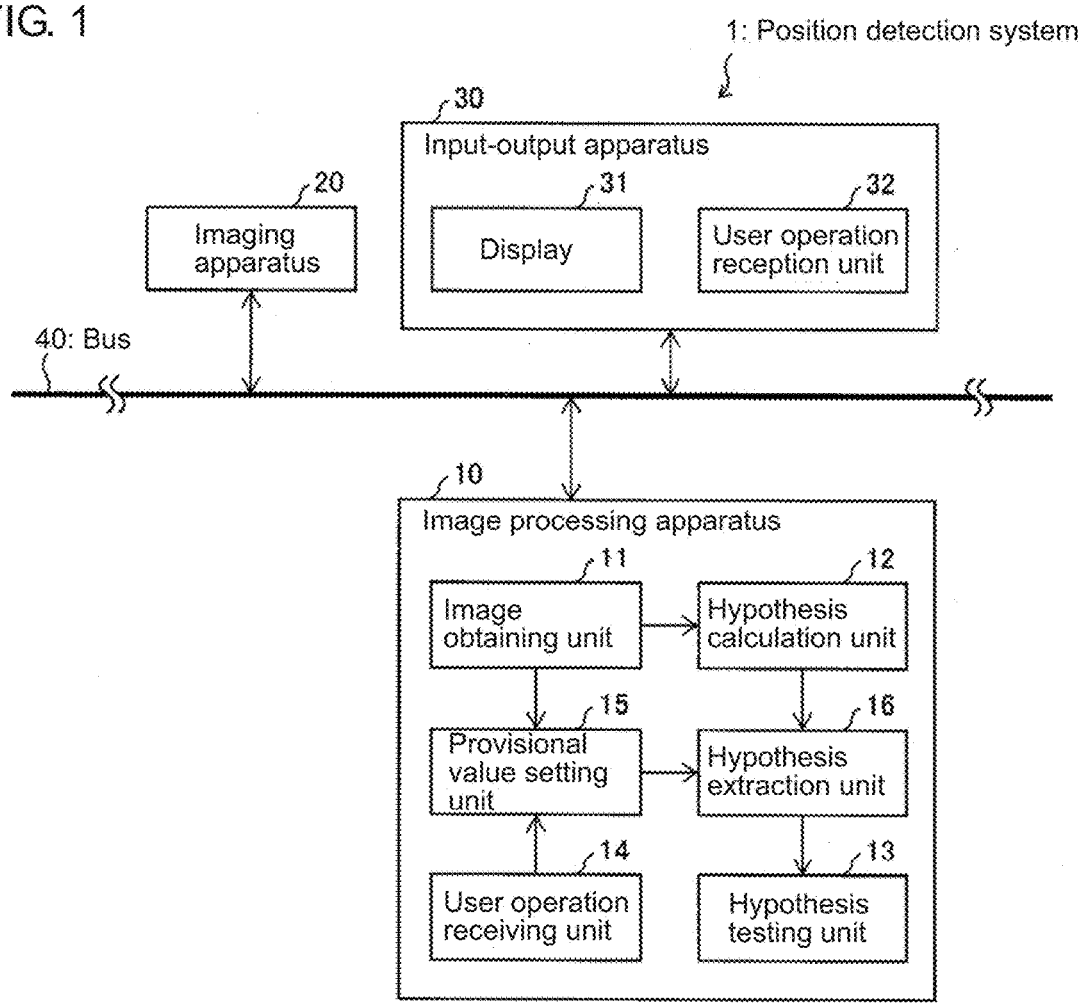
FIG. 1 is a block diagram showing the main components of an image processing apparatus, an imaging apparatus, and an input-output apparatus included in a position detection system according to a first embodiment of the present invention.

FIG. 1 is a block diagram showing the main components of the image processing apparatus 10, an imaging apparatus 20, and an input-output apparatus 30 included in the position detection system 1. As shown in FIG. 1, the position detection system 1 includes the image processing apparatus 10 (position detection apparatus), the imaging apparatus 20, and the input-output apparatus 30, which transmit and receive data to and from one another through a bus 40.

The imaging apparatus 20 captures an image of an object for which a parameter associated with a position (e.g., the coordinate of the central position) is to be estimated with the image processing apparatus 10, and outputs the captured image data to the image processing apparatus 10 and the input-output apparatus 30. The imaging apparatus 20 outputs image data including the captured image of the object (e.g., a disc substrate such as a semiconductor wafer), or more specifically, image data including the plane shape I50 of the object, to the image processing apparatus 10 and the input-output apparatus 30. The imaging apparatus 20 may be, for example, a digital camera or a digital video camera. Although the object is a disc substrate such as a semiconductor wafer in the present embodiment, the object may not be a disc substrate.

Capturing an image herein includes capturing a moving image, or recording a moving image with a video camera, in addition to capturing a still image, or for example, taking a photograph. The captured image herein may be a digital image or an analog image. The captured image may not be a single still image, but may be an image of one frame constituting a moving image.

The imaging apparatus 20 may be any apparatus that captures an image of the object such as a semiconductor wafer, and provides the captured image (plane shape I50) to the image processing apparatus 10. More specifically, the imaging apparatus 20 captures an image of a subject with an image sensor, generates the captured image data, and outputs the generated captured image data to the image processing apparatus 10. The imaging apparatus 20 includes, for example, an imaging lens, an image sensor, a frame memory, a mechanical unit, a motor, and a flash unit. The image sensor may be a charge-coupled device (CCD) or a complementary metal oxide semiconductor (CMOS). The imaging apparatus 20 may capture an image with, for example, flashlight in accordance with the imaging conditions in response to an imaging instruction provided from the image processing apparatus 10, and may generate the captured image data.

The input-output apparatus 30 is used by an operator or an administrator (user) to input information about an operation to estimate the parameter associated with the position of the object (and the plane shape I50, which is a captured image of the object) and to verify the information about the operation. The input-output apparatus 30 transmits the input information to the image processing apparatus 10 and/or the imaging apparatus 20, obtains information requested by the user from the image processing apparatus 10 and/or the imaging apparatus 20, and displays the obtained information.

The input-output apparatus 30 may be arranged near or distant from the image processing apparatus 10. The input-output apparatus 30 distant from the image processing apparatus 10 is connected to the system through a network or wirelessly, and is controlled remotely.

The input-output apparatus 30 includes a display 31 and a user operation reception unit 32.

The display 31 includes a display area for a screen display to provide information to the user. The display 31 displays various pieces of information including letters or images on the screen based on screen data received from the image processing apparatus 10 or the imaging apparatus 20. For example, the display 31 displays an image captured by the imaging apparatus 20. The display 31 may be, for example, a liquid crystal display (LCD), a plasma display panel (PDP), or an electroluminescence (EL) display.

The user operation reception unit 32 receives various inputs from the user. The user operation reception unit 32 may be, for example, an input button to which each function is assigned, a keyboard, or a mouse. The user operation reception unit 32 may be any other input device. For example, the display 31 may include a touch panel as the user operation reception unit 32 to allow touch input. The user operation reception unit 32 generates an operation signal or operation data in accordance with the received user operation, and transmits the generated data to the image processing apparatus 10.

Examples of information input by the user with the user operation reception unit 32 include the work type or the processing details for the image processing apparatus 10 and the imaging apparatus 20. The information appearing on the display 31 for verification by the user includes the processing results obtained by the image processing apparatus 10 and the imaging apparatus 20, and information about an object for which the parameter associated with the position is to be estimated by the image processing apparatus 10 (more precisely, a captured image of the object).

Although its details are described later with reference to FIG. 4, the input-output apparatus 30 displays the image of the object (the captured image of the object including the plane shape I50) captured by the imaging apparatus 20 on the display 31. For the captured image appearing on the display 31, the user performs an operation described below to designate an outline E51 (edge) of the plane shape I50 of the object by operating, for example, a mouse, More specifically, the user designates an edge extraction area (arch area with a width) SA1 for the captured image including the plane shape I50, and also sets the number of lines by which the edge is scanned in the edge extraction area SA1 (e.g., scanlines SL1 to SL11 shown in FIG. 4). When receiving a user operation for setting the edge extraction area SA1 and the lines (the number of lines), the input-output apparatus 30 transmits the user operation to the image processing apparatus 10.

The image processing apparatus 10 obtains image data including the captured image of an object (e.g., a disc substrate such as a semiconductor wafer) for which the parameter associated with the position is to be determined from the imaging apparatus 20, or more specifically obtains image data including the plane shape I50 of the object. The image processing apparatus 10 performs position detection processing (more specifically, the processing for determining an estimated value of the parameter associated with the position) for the plane shape I50 (a captured image of an object) to determine the parameter associated with the position of the object.

When receiving a user operation for setting the edge extraction area SA1 and the lines (the number of lines) from the input-output apparatus 30, the image processing apparatus 10 sets a provisional center PP1 (provisional parameter) in accordance with the user operation (described later). When setting the provisional center PP1 without using the edge extraction area SA1 and the lines (the number of lines), the image processing apparatus 10 may not receive the user operation from the input-output apparatus 30. More specifically, the image processing apparatus 10 may not receive a user operation from the input-output apparatus 30. The position detection system 1 may not include the input-output apparatus 30.

Although the image processing apparatus 10 according to the present embodiment obtains (receives) a captured image including the plane shape I50 from the imaging apparatus 20, the image processing apparatus 10 may include the imaging apparatus 20 instead of an image obtaining unit 11. More specifically, the image processing apparatus 10 may capture an image of the object and estimate the parameter associated with the position of the captured image (the plane shape I50) of the object to determine the parameter associated with the position of the object.

This completes the overview of the image processing apparatus 10 (position detection apparatus), the imaging apparatus 20, and the input-output apparatus 30 included in the position detection system 1. For easier understanding of the image processing apparatus 10, a technique for positioning objects to be processed or inspected in manufacturing processes, such as fabrication of semiconductor wafers, will now be described.

Known Method for Position Detection

Positioning objects to be processed or inspected in manufacturing processes, such as fabrication of semiconductor wafers, involves the processing for applying a shape selected in accordance with an edge input including a measurement error, and calculating the center of the object shape. The positioning thus involves the processing for precisely estimating the parameter associated with the position (e.g., the central position) of the plane shape of the object obtained from a captured image of the object.

The shape to be applied can often have Insufficient measurement data corresponding only to a part of the shape. This greatly lowers the estimation accuracy of the detection technique known in the art. In such cases, the image processing apparatus 10 can achieve high accuracy estimation and also high-speed estimation processing.

Common techniques for such positioning mainly include positioning using alignment marks and positioning without using alignment marks. Without alignment marks, the positioning uses the edge of an object, and thus uses coefficients calculated with fitting and geometric computations for a straight line and a circle based on a straight edge line and a circular edge line. Fitting is a technique for applying a predetermined function to the object shape (the outline of an object) and parametrically representing the object shape. Geometric computations, including intersection, distance, or angle computations, are used to determine the relevance between the fitted shapes.

The image processing apparatus 10 positions an object with fitting, or specifically with hypothesis testing. Such hypothesis testing fitting will be described briefly for easier understanding of the image processing apparatus 10. Hypothesis testing fitting is classified into random sampling for high-speed estimation processing, which is called random sample consensus (RANSAC), and full search sampling. The image processing apparatus 10 can use either RANSAC or full search sampling. The hypothesis testing fitting classified as the most basic full search sampling will now be described.

Hypothesis Testing Fitting

Hypothesis testing fitting basically includes the two processes below. The first process is to calculate values (set hypotheses) for the parameter associated with the position (e.g., the central position) of the plane shape based on each combination of a plurality of points selected from a plurality of detection points on the outline (edge) of the plane shape (hypothesis setting). The second process is to determine, as an estimated value for the parameter associated with the position of the plane shape, one of the plurality of calculated values (hypotheses) having the highest evaluation performed using the plurality of detection points (hypothesis evaluation and hypothesis testing).

Among other hypothesis testing fitting techniques, hypothesis testing circle fitting has undergone various developments, an example of which is described in Patent Literature 1. Such hypothesis testing circle fitting will now be described briefly.

The first process of hypothesis testing circle fitting is to select any points (selection points) from a plurality of input points (detection points) on the circumference. The second process is to calculate a hypothesis circle using only the selected points (selection points). The third process is to calculate the distance from each of the other input points (input points other than the selection points) to the hypothesis circle, and determine an input point falling within a certain distance range as a support point (as an inlier, which is a point supporting the calculated values). More precisely, the support point refers to a point on the shape defined based on the hypothesis calculated values or a point belonging to the shape defined based on the hypothesis calculated values (or an inlier, which is a point within a permissive range of hypothesis calculated values). The fourth process is to determine a hypothesis (calculated value) with many support points (inliers) as a final estimated value. The third and fourth processes may be modified as described below. In the modified third process, the distance from each of the other input points to the hypothesis circle is calculated, and the sum of the distances may be used as an evaluation value. In the modified fourth process, a hypothesis circle (calculated value) with the smallest evaluation value is determined as a final estimated value.

With hypothesis testing circle fitting, M selection points may be selected from N detection points on the edge (outline), and at least one hypothesis circle is calculated for each combination of the M selection points (hypothesis associated with the coordinates of the central position, or specifically the calculated value for the coordinates of the central position). In this example, $_NC_M$ combinations of M selection points are available for selecting M selection points from the N detection points. With hypothesis testing circle fitting, $_NC_M$ or more hypothesis circles (calculated values) are thus calculated, and each of the $_NC_M$ or more hypothesis circles is evaluated using the detection points, and then one of the hypothesis circles is selected (determined) as a final estimated value. The evaluation using detection points uses, for example, the number of support points (inliers), or specifically the number of detection points having a distance to the hypothesis circle falling within a predetermined value range or using the sum of distances from other detection points (detection points other than the selection points) to the hypothesis circle.

For such hypothesis testing circle fitting, $O(N^M)$ is the processing time for calculating the $_NC_M$ hypothesis circles. Thus, M is preferably as small as possible. Fitting of a circle with an unknown radius is performed at the highest speed when M=3. For fitting of a circle with a predetermined radius, M may be M=2. A hypothesis testing algorithm with M=2 for the central position of a substantially circular shape with a fixed radius (with a predetermined radius) will now be described.

The first process is to select any two points (two selection points) from a plurality of detection points (N detection points) on the circumference of a substantially circular shape with a predetermined radius. The second process is to set a point at the same distance (predetermined radius) from the two selection points as a calculated value for the central position of the substantially circular shape (calculated value for the central position). The third process is to calculate the distance from each of the other detection points (detection points other than the selection points) to the hypothesis circle (circle with the predetermined radius and having the calculated value as the center), determine detection points that fall within a predetermined distance range as support points (inliers). The fourth process is to determine a calculated value (hypothesis circle) having the largest number of support points (inliers) as a final estimated value.

However, the use of the two points (two selection points) selected from the N input points (detection points) on the edge of the substantially circular shape with a fixed radius yield two calculated hypothesis circles (namely, two calculated values). This will now be described below with reference to FIG. 2.

Figure 2:
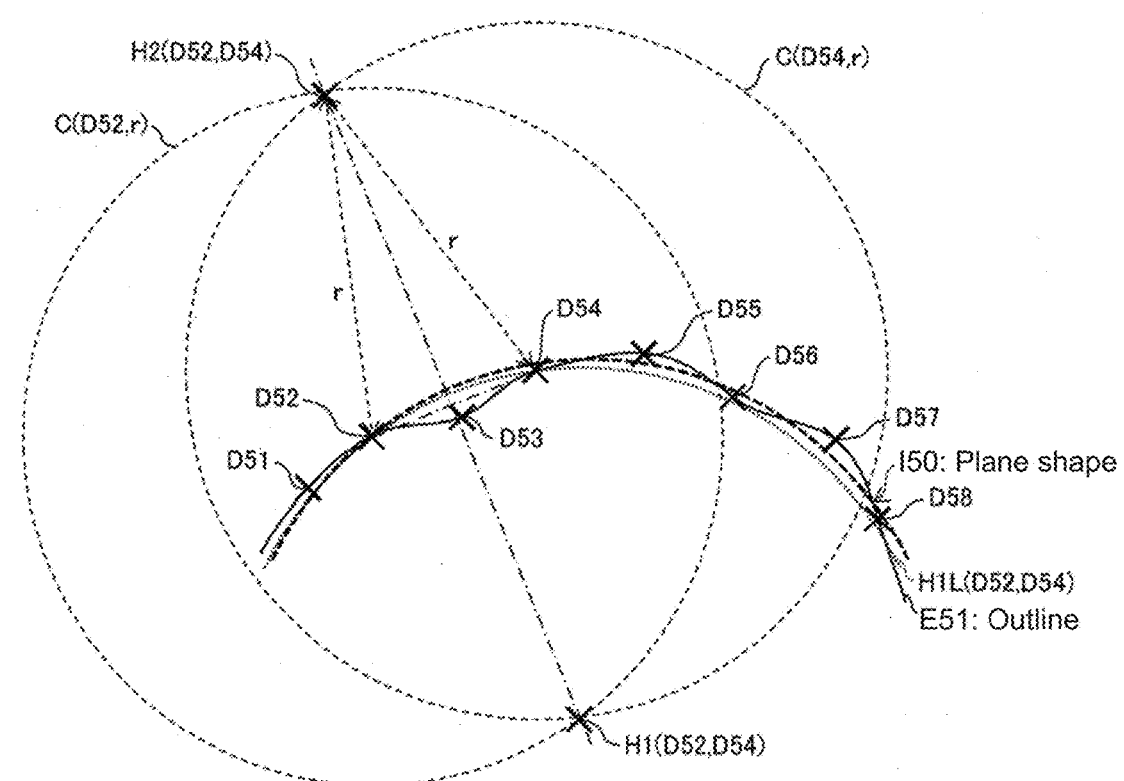
FIG. 2 is a diagram describing the issue of unspecified values occurring when the central position of a (substantially) circular shape with a predetermined radius is calculated using two selection points on the outline of the (substantially) circular shape.

The relationship between the plane shape I50 and the outline E51 shown in FIGS. 2 and 3 may be noted as described below. The plane shape I50 is a correct shape, which is actually drawn using shape parameters to be finally obtained, whereas the outline E51 is an actual appearance of the shape, or an appearance of the shape edge. The detection points D51 and D52 to D58 each represent a part of the outline E51. With the outline E51 being affected by measurement errors, distorted appearance of the shape, missing part or flaws of the shape, the detection points D51 and D52 to D58 are not usually aligned with points on the plane shape I50. In FIG. 2, the difference between the plane shape I50 and the outline E51 is exaggerated for easy understanding.

The edge extraction area SA1 is an area defined by a user to obtain the detection points D51 and D52 to D58 either by sampling the outline E51 or by directly obtaining several points belonging to the outline E51. Although the edge is normally a continuous line, scanlines may be defined, and the intersections between the scanlines and the edge are then calculated to obtain the detection points D51 and D52 to D58. When the edge is extracted as a continuous line, such scanlines are not used. That is equivalent the case in which a maximum number of detection points D51 and D52 to D58 are extracted.

The detection points D51 and D52 to D58 may be arranged with any density. Further, the detection points D51 and D52 to D58 as a group of detection points with a predetermined density may be extracted with any method.

FIG. 2 is a diagram describing the issue of unspecified values (two values calculated using the two selection points) occurring when the central position of a substantially circular shape with a predetermined radius is to be estimated using the two selection points on the outline of the substantially circular shape. More specifically, FIG. 2 shows the phenomenon in which two calculated values (namely, H1 and H2) are calculated using two selection points (e.g., the points D52 and D54) selected from the N detection points D51 and D52 to Dn on the outline E51 (edge) when the central position of the plane shape I50, which is a substantially circular shape with radius r, is estimated (The detection points D51 and D52 to Dn can be actually obtained without the outline E51, or in other words the outline E51 (edge) may not be used to obtain the detection points D51 and D52 to Dn.). This will be described in detail below.

As shown in FIG. 2, any two selection points (e.g., the points D52 and D54) are selected from the N detection points D51 and D52 to Dn (hereafter simply D51 to Dn as appropriate) on the outline E51 of the plane shape I50 (whereas the detection points D51 and D52 to Dn can be obtained without the outline E51 as described above). A circle C (D52, r) with radius r and having the selection point D52 as the center, and a circle C (D54, r) with radius r and having the selection point D54 as the center are drawn to determine intersections H1 (D52, D54) and H2 (D52, D54) between these two circles. More specifically, the points H1 and H2 are obtained as calculated values for the central position of the plane shape I50 (calculated values for the parameter associated with the position of the plane shape I50) using the two selection points D52 and D54 selected from the N detection points D51 to Dn on the outline E51 of the plane shape I50.

In this process, the two hypothesis circles with radius r and each having the point H1 or the point H2 as the center can both be evaluated using the detection points D51 to Dn (in particular, the detection points D51 to Dn other than the selection points D52 and D54). In FIG. 2, for example, a curve H1L (D52, D54) refers to the circumference of the hypothesis circle with radius r and having the point H1 (D52, D54) as the center.

In other words, with the hypothesis testing circle fitting technique known in the art, the above two hypothesis circles (the circles each with radius r and having the point H1 or H2, which is the calculated value, as the center) are both evaluated (tested) using, for example, the number of detection points D51 to Dn (in particular, the detection points D51 to Dn other than the selection points D52 and D54) each having a distance to each of the two hypothesis circles falling within the predetermined value range. More specifically, all the calculated hypothesis circles (circles each with radius r and having the calculated value as the center) are evaluated (tested) by counting the number of detection points other than the selection points having a distance to each hypothesis circle falling within the predetermined value range, and determining a hypothesis circle (calculated value) with the largest number of detection points as a final estimated value.

With another hypothesis testing circle fitting technique known in the art, the two hypothesis circles are evaluated (tested) using the sum of distances from the two hypothesis circles to the detection points D51 to Dn other than the selection points D52 and D54. More specifically, all the calculated hypothesis circles (circles each with radius r and having the calculated value as the center) are evaluated (tested) by measuring the distance from each of the detection points other than the selection points to the hypothesis circles, and by determining a hypothesis circle (calculated value) with the smallest sum of the distances as a final estimated value.

More specifically, with the hypothesis testing circle fitting techniques known in the art, two hypothesis circles (or two calculated values) are calculated using each combination of two selection points selected from the N detection points D51 to Dn on the outline E51 of the plane shape I50, and one of the calculated $2*_NC_2$ hypothesis circles is selected as a final estimated value by evaluating the $2*_NC_2$ hypothesis circles using the detection points D51 to Dn.

However, if the final estimated value can be selected by evaluating the $_NC_2$ hypothesis circles ($_NC_2$ calculated values) instead of evaluating all the $2*_NC_2$ hypothesis circles (all the calculated values) using the detection points, the time taken for evaluation (calculation time) can be reduced. The image processing apparatus 10 evaluates the $_NC_2$ hypothesis circles using the provisional center PP1 (provisional parameter associated with the central position of the plane shape I50), instead of evaluating all the $2*_NC_2$ hypothesis circles. The image processing apparatus 10 thus achieves high-speed estimation processing with high accuracy estimation as when evaluating all the $2*_NC_2$ hypothesis circles. A method for hypothesis testing circle fitting performed by the image processing apparatus 10 using the provisional center PP1 will now be described with reference to FIG. 3.

Hypothesis Testing Fitting According to Embodiment

Figure 3:
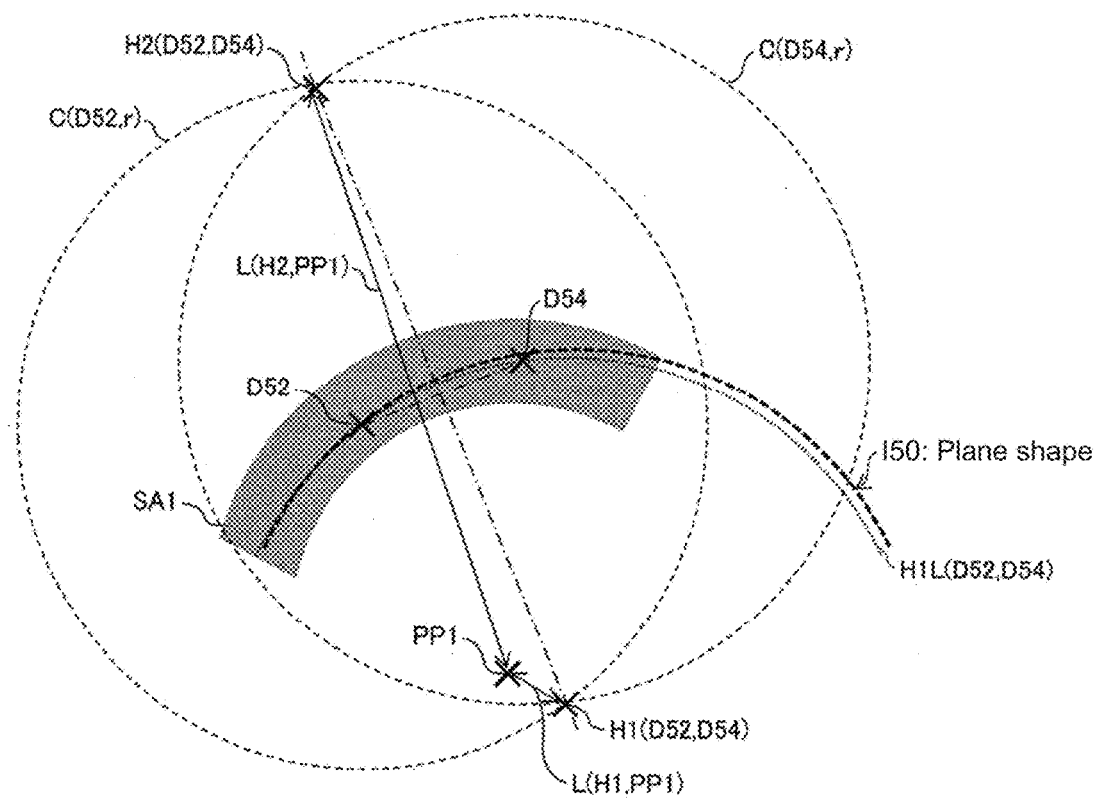
FIG. 3 is a diagram describing a method for removing the issue of unspecified values shown in FIG. 2 using a provisional center.

FIG. 3 is a diagram describing a method for removing the issue of unspecified values shown in FIG. 2 (two values are calculated using two selection points) using the provisional center PP1. As shown in FIG. 3, the image processing apparatus 10 sets the provisional center PP1 as the provisional parameter associated with the central position of the plane shape I50. Of the points H1 and H2 obtained from calculations using the two selection points D52 and D54, the image processing apparatus 10 extracts one point with the shorter distance to the provisional center PP1 as a value calculated using the selection points D52 and D54. More specifically, the image processing apparatus 10 compares a distance L (H1, PP1) from the point H1 to the provisional center PP1 with a distance L (H2, PP1) from the point H2 to the center PP1, and extracts one of the two points with the shorter distance to the provisional center PP1 (e.g., the point H1) as the value calculated using the selection points D52 and D54. The image processing apparatus 10 sets the point H1 as the candidate for evaluation (testing) performed using the detection points D51 to Dn (in particular, the detection points D51 to Dn other than the selection points D52 and D54). In FIG. 3, the curve H1L (D52, D54) represents the circumference of the hypothesis circle with radius r and having the point H1 (D52, D54) as the center.

In other words, the image processing apparatus 10 excludes, from the evaluation target using the detection points D51 to Dn, at least one of the two calculated values (e.g., the points H1 and H2) calculated using each combination of two selection points (e.g., the selection points D52 and D54) selected from the N detection points D51 to Dn. The image processing apparatus 10 excludes at least one of the two calculated values from the evaluation target based on their relevance to the provisional center PP1. More specifically, the image processing apparatus 10 extracts a calculated value whose relevance to the provisional center PP1 falls within a predetermined range from the total of $2*_NC_2$ calculated values obtained using each combination of two selection points selected from the N detection points D51 to Dn, and evaluates (tests) only the extracted value using the detection points D51 to Dn.

For the point H1, the image processing apparatus 10 counts the number of detection points D51 to Dn other than the selection points D52 and D54 (support points, or inliers) each having a distance to the hypothesis circle H1L (D52, D54) with radius r and having the point H1 as the center falling within the predetermined range, or measures the distance from each of the detection points D51 to Dn other than the selection points D52 and D54 to the hypothesis circle H1L (D52, D54) to obtain the sum of the distances (sum of the deviation distances). Similarly, for the calculated value (point Hp) whose relevance to the provisional center PP1 falls within the predetermined range, which is selected from calculated values (points Hp and Hq) obtained using a combination other than the combination of points D52 and D54 (e.g., the combination of points D51 and D55), the image processing apparatus 10 counts the number of detection points D51 to Dn (support points, or inliers) other than the selection points D51 and D55 each having a distance to the hypothesis circle with radius r and having the point Hp as the center falling within the predetermined value range, or measures the distance from each of the detection points D51 to Dn other than the selection point D51 and D55 to the hypothesis circle to obtain the sum of the distances (sum of the deviation distances). As described above, the image processing apparatus 10 obtains the number of support points (inliers) and/or the sum of the deviation distances for each calculated value (more precisely, each hypothesis circle with radius r and having the calculated value as the center) whose relevance to the provisional center PP1 (provisional parameter) falls within the predetermined range. The image processing apparatus 10 determines a hypothesis circle (calculated value) with the largest number of support points (inliers) or with the smallest sum of the deviation distances as a final estimated value.

In this process, the image processing apparatus 10 estimates and sets the provisional center PP1 using, for example, an area (the edge extraction area SA1) designated by the user as an area including the outline E51 of the plane shape I50. A method used by the image processing apparatus 10 for setting the provisional center PP1 will be described below with reference to FIGS. 4 and 5.

The image processing apparatus 10 described above extracts one of the points H1 and H2 with the shorter distance to the provisional center PP1, and sets the extracted point to be evaluated (tested) using the detection points D51 to Dn. However, the image processing apparatus 10 may extract, from the points H1 and H2, a calculated value whose distance from the provisional center PP1 falls within the predetermined range. More specifically, the image processing apparatus 10 may set both the points H1 and H2 as the candidates for evaluation (testing) performed using the detection points D51 to Dn based on their relevance to the provisional center PP1, or exclude both these points from the candidates for evaluation (testing) performed using the detection points D51 to Dn. The image processing apparatus 1 may set, from the plurality of calculated values, only the calculated values whose relevance to the provisional center PP1 (provisional parameter) falls within the predetermined range as the candidates for evaluation performed using the detection points D51 to Dn.

The image processing apparatus 10 described briefly above will now be summarized. The image processing apparatus 10 includes a hypothesis calculation unit 12 (calculation unit), a hypothesis extraction unit 16 (extraction unit), and a hypothesis testing unit 13 (determination unit). The hypothesis calculation unit 12 calculates a parameter defining the plane shape I50 (e.g., the parameter associated with the position of the plane shape I50), or more specifically calculates values (e.g., the points H1 and H2) for the central position of the plane shape I50 using each combination of selection points (e.g., the combination of points D52 and 54) selected from the detection points D51 to Dn for the plane shape I50 (e.g., the detection points D51 to Dn on the outline E51 of the plane shape I50) (obtained as image data for example). The hypothesis extraction unit 16 extracts, from the calculated values (e.g., the points H1 and H2) calculated by the hypothesis calculation unit 12, one or more calculated values (e.g., the point H1) whose relevance to the provisional parameter (e.g., the provisional center PP1, or specifically the central position of the plane shape I50) falls within the predetermined range. The provisional parameter is an estimated value or an estimated range of values for the parameter defining the plane shape I50 with a method different from the calculation method used by the hypothesis calculation unit 12 to calculate the values (e.g., the parameter associated with the position of the plane shape I50, or specifically the central position of the plane shape I50). The hypothesis testing unit 13 determines, from the calculated values extracted by the hypothesis extraction unit 16, a value with the highest evaluation performed using the detection points D51 to Dn as an estimated value for the parameter defining the plane shape I50.

The image processing apparatus 10 with the above structure evaluates (tests), using the detection points, one or more calculated values (e.g., the point H1) whose relevance to the provisional parameter (e.g., the provisional center PP1) falls within the predetermined range extracted from the plurality of calculated values (e.g., the points H1 and H2) calculated using each combination of selection points (e.g., the combination of points D52 and D54). The image processing apparatus 10 can thus output the best-possible result that can be estimated from the group of detection points by eliminating the effect of hypotheses with low accuracy. The image processing apparatus 10 thus achieves high accuracy estimation as when evaluating all the values calculated using each combination of selection points, and achieves higher-speed evaluation processing than the evaluation processing performed using all the calculated values. In other words, the image processing apparatus 10 has high robustness against abnormal detection points caused by measurement errors and the surrounding noise, and achieves both high accuracy estimation and high-speed estimation processing.

The hypothesis testing fitting technique may also improve the processing speed of estimation by reducing the number of combinations for selecting the M selection points to obtain the calculated values. For example, the hypothesis testing fitting technique may improve the processing speed of estimation by, for example, extracting, or randomly sampling combinations from the $_NC_M$ combinations, and evaluating (testing) only the calculated values obtained using the extracted combinations. However, the hypothesis testing fitting technique can lower the accuracy of calculated values of shape parameters calculated from the selection points depending on the method for selecting these points, and then can lower the overall accuracy.

To respond to this issue, the image processing apparatus 10 sets the provisional parameter (e.g., the provisional center) with a predetermined method, and extracts, as the candidates for evaluation (testing), one or more calculated values whose relevance to the provisional parameter falls within the predetermined range (or near the provisional parameter for example), without reducing the number of selection points (or the number of combinations of selection points) for obtaining calculated values. More specifically, the image processing apparatus 10 performs hypothesis testing for the calculated values extracted based on a primary selection criteria using the provisional parameter, and rejects other calculated values each having an error with a predetermined value or more from the provisional parameter.

The image processing apparatus 10 may also evaluate (test) the plurality of calculated values extracted using the provisional parameter with, for example, the method described below. The image processing apparatus 10 may evaluate (test) each of the extracted calculated values with either a method using an error (accumulated error) (called a reprojection error) obtained by calculating an error between the shape defined based on the calculated values and the detection points other than the selection points for the shape, or a method using the number of detection points other than the selection points whose error falls within a predetermined range.

The plane shape I50 for which the image processing apparatus 10 performs position detection (or the processing for determining an estimated value of the parameter associated with the position) is a captured image of an object (e.g., a disc substrate such as a semiconductor wafer) for which the parameter associated with the position is to be determined by the image processing apparatus 10, and/or a measurement value for the object. In the present embodiment, the image processing apparatus 10 obtains the captured image of the object and/or the measurement value from the imaging apparatus 20.

The image processing apparatus 10 with the above structure obtains the captured image of the object and/or the measurement value (e.g., a captured image including the plane shape I50) as image data or as data, and estimates a parameter defining the plane shape I50 included in the obtained image data or the obtained data (e.g., the parameter associated with the position of the plane shape I50) to determine the parameter defining the object (e.g., the parameter associated with the position of the object).

The hypothesis testing unit 13 (determination unit) determines the estimated value (or the central position of the plane shape I50) from one or more calculated values (e.g., the point H1) extracted by the hypothesis extraction unit 16 (extraction unit) using the number of detection points D51 to Dn that are located within a predetermined distance from the plane shape estimated using the calculated values (e.g., from the outline of the hypothesis circle H1L (D52, D54)) (more specifically, the hypothesis circle with radius r and having the point H1 as the center) and/or the sum of distances from the plane shape estimated using the calculated values (e.g., from the outline of the hypothesis circle H1L (D52, D54)) (more specifically, the hypothesis circle with radius r and having the point H1 as the central position) to each of the detection points D51 to Dn.

The image processing apparatus 10 with the above structure determines the estimated value from the above calculated values, or specifically, for example, determines as the estimated value, a calculated value with the largest number of detection points located within the predetermined distance from the outline of the plane shape estimated using the calculated values, or determines, as the estimated value, a calculated value with the smallest sum of distances from the outline of the plane shape estimated using the calculated values to each of the detection points.

As described above with reference to FIG. 3, the image processing apparatus 10 obtains the number of support points (inliers) and/or the sum of the deviation distances for each of the calculated values (more precisely, each hypothesis circle with radius r and having the calculated value as the center) whose relevance to the provisional center PP1 (provisional parameter) falls within the predetermined range. The image processing apparatus 10 then determines a hypothesis circle (calculated value) with the largest number of support points (inliers) or a hypothesis circle (calculated value) with the smallest sum of the deviation distances as a final estimated value.

This completes the overview of the image processing apparatus 10. The method used by the image processing apparatus 10 for setting the provisional center PP1 will now be described in detail with reference to FIGS. 4 and 5.

Method for Setting the Provisional Center

Figure 4:
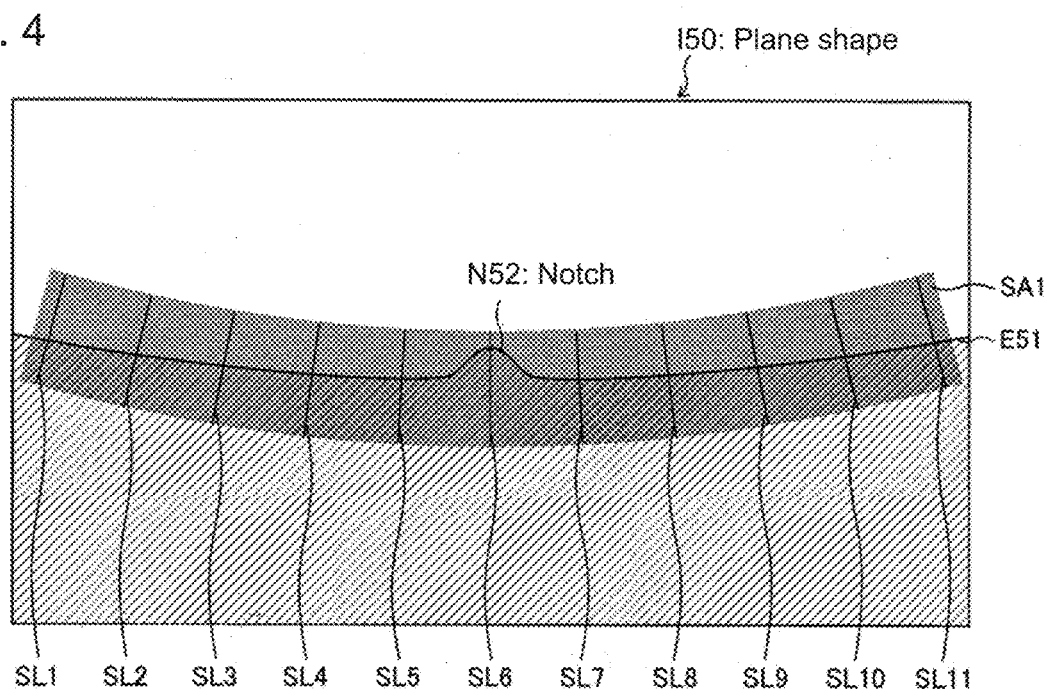
FIG. 4 is a diagram describing a method with which a user designates an area including an edge of a (substantially) circular shape used to set a provisional center.

FIG. 4 is a diagram describing a method with which the user designates the edge extraction area SA1, which is an area including the edge E51 of the plane shape I50. The edge extraction area SA1 is used by the image processing apparatus 10 to set the provisional center PP1 of the plane shape I50.

As shown in FIG. 4, the user performs an operation described below to designate an outline E51 (edge) of the plane shape I50 of the object by operating, for example, a mouse on the captured image of the object (the captured image of the object including the plane shape I50) captured by the imaging apparatus 20 appearing on the display 31 in the input-output apparatus 30. More specifically, the user designates an area including the outline E51 of the plane shape I50 as the edge extraction area SA1 (arch area with a width) for the captured image including the plane shape I50. The user also sets the number of lines by which the edge is to be scanned in the edge extraction area SA1.

The edge extraction area SA1 is an area set for the image processing apparatus 10 to easily detect the N detection points D51 to Dn on the outline E51 of the plane shape I50. The setting of the edge extraction area SA1 is a common technique used for detecting the plane shape of an object (in particular, its outline) from a captured image of the object, and will not be described in detail. Although the edge extraction area SA1 is set along the outline E51 including a notch N52 in the example shown in FIG. 4, the edge extraction area SA1 may be set along the outline E51 including no notch N52.

When receiving a user operation for setting the edge extraction area SA1 and the lines (the number of lines) from the input-output apparatus 30, the image processing apparatus 10 analyzes the edge extraction area SA1 and detects the N detection points D51 to Dn on the outline E51 of the plane shape I50.

In detail, the image processing apparatus 10 sets scanlines (lines for scanning the edge, which are for example the scanlines SL1 to SL11 in FIG. 4) that extend through the center of the arch area with a width (e.g., the edge extraction area SA1 in FIG. 4) and extend radially at equal intervals in the arch area (arch). The image processing apparatus 10 then calculates the coordinates for a sub-pixel with the highest edge intensity on the scanlines.

The image processing apparatus 10 calculates, as the provisional center PP1, the center of the arch area (edge extraction area SA1) using the edge extraction area SA1, which is an arch area with a width, and using the lines (the number of lines). The image processing apparatus 10 may use any method for calculating the provisional center PP1 using the edge extraction area SA1 and the lines (the number of lines). For example, the image processing apparatus 10 may use a method known in the art for estimating the center of an arch area using information about the arch area. To calculate the provisional center PP1 using the edge extraction area SA1 and the lines (the number of lines), the image processing apparatus 10 uses any method different from the method used by the image processing apparatus 10 to calculate the points H1 and H2 using the combination of points D52 and D54.

FIGS. 5A and 5B are diagrams each describing an example method for setting the provisional center PP1 of the plane shape I50 other than the method described with reference to FIG. 4. FIG. 5A shows an example in which the provisional center PP1 is set by the image processing apparatus 10 using a notch S53 on the outline E51 of the plane shape I50 (edge). FIG. 5B shows an example in which the provisional center PP1 is set by the image processing apparatus 10 using an edge normal (a line normal to the edge) T54 of the plane shape I50.

As shown in FIG. 5A, the image processing apparatus 10 may set the provisional center PP1 at a position inward from the notch S53 on the outline E51 of the plane shape I50 by a distance equal to the radius r. The image processing apparatus 10 may set the provisional center PP1 based on the radius r and an orientation flat on the outline E51 of the plane shape I50, instead of using the notch S53.

As shown in FIG. 5B, the image processing apparatus 10 may set the provisional center PP1 using the edge normal T54 of the plane shape I50. More specifically, when the direction of the edge of the plane shape I50 is known (the direction of the edge, or the edge direction, is a direction orthogonal to the edge line), the image processing apparatus 10 may set the provisional center PP1 at a position away from the edge to the positive or the negative side of the edge direction by a distance equal to the radius r. The positive or negative direction is determined based on the relationship between the brightness of the object and the brightness of the background, as well as a filter coefficient used for the edge extraction.

The image processing apparatus 10 may further set the provisional center PP1 of the plane shape I50 with a method other than the methods described with reference to FIG. 4 and FIGS. 5A and 5B. More specifically, the image processing apparatus 10 may set the provisional center PP1 using the features of the workpiece (e.g., alignment marks).

The image processing apparatus 10 may set the provisional center PP1 at a position directly designated by the user as the central position of the plane shape I50. The user may designate the position by, for example, viewing the captured image of the object (the captured image of the object including the plane shape I50) obtained by the imaging apparatus 20 appearing on the display 31 in the input-output apparatus 30.

The image processing apparatus 10 may estimate the edge direction and/or the direction of the center of the plane shape I50 based on the direction directly designated by the user viewing the captured image of the object as the edge direction and/or the center direction of the plane shape I50, and may set the provisional center PP1 based on the estimated edge direction and/or the estimated center direction, and the radius r.

The image processing apparatus 10 may further display selection items such as the upper right, lower right, upper left, or lower left on the screen for selecting the center direction of the plane shape I50, together with the captured image of the object on the display 31 in the input-output apparatus 30. The image processing apparatus 10 may estimate the center direction of the plane shape I50 based on a selection item selected by the user, and may further set the provisional center PP1 based on the estimated center direction and the radius r.

In other words, the image processing apparatus 10 may set the provisional parameter (e.g., the provisional center) associated with the position of the plane shape I50 using the parameter associated with the position of the plane shape I50 directly designated by the user.

The image processing apparatus 10 may set a value estimated by, for example, another processing apparatus (function) or a sensor, or a value estimated based on the apparatus structure or the apparatus constraints as the provisional parameter associated with the position of the plane shape I50 (the provisional center PP1). The image processing apparatus 10 may set a value calculated with a method (e.g., a simpler position estimation method such as Hough transform or the least square method) different from the method for calculating the points H1 and H2 using the combination of points D52 and D54 used by the image processing apparatus 10 as the provisional parameter (the provisional center PP1).

The image processing apparatus 10 described above extracts one or more calculated values whose relevance to the provisional center PP1, which is a value estimated as the central position of the plane shape I50, falls within the predetermined range (e.g., with the distance to the provisional center PP1 falling within the predetermined range). However, the image processing apparatus 10 may also extract one or more calculated values whose relevance to the provisional center area, which is an area estimated as the central position of the plane shape I50, falls within the predetermined range (for example, calculated values within the provisional center area). More specifically, the provisional parameter used to extract one or more calculated values for evaluation (testing) performed using the detection points used by the image processing apparatus 10 may be any value (the provisional center PP1) or any range of values (the provisional center area) estimated for the parameter associated with the position of the plane shape I50. The image processing apparatus 10 may also extract only the calculated value for which the direction of a vector linking the calculated value and each detection point relative to the direction of a vector linking the provisional center PP1 and each detection point falls within a predetermined range. A method for setting the provisional center area, which is the same as the method for setting the provisional center PP1 described above, will not be described in detail. A method for extracting a calculated value using the provisional center area is also the same as the method for extracting a calculated value using the provisional center PP1 described above. More specifically, the image processing apparatus 10 may extract, for example, a calculated value included in the provisional center area from the calculated values obtained using each combination of selection points.

Among the methods for setting the provisional parameter (the provisional center PP1 or the provisional center area) used by the image processing apparatus 10, the method for setting the provisional parameter using the parameter associated with the position of the plane shape I50 designated by the user with a predetermined method will now be summarized.

The image processing apparatus 10 includes a provisional value setting unit 15 (setting unit). The provisional value setting unit 15 sets, as the provisional center PP1 (provisional parameter), a value or a range of values estimated using the edge extraction area SA1 designated by the user as an area including the outline E51 of the plane shape I50, and/or a value or a range of values designated by the user as the parameter defining the plane shape I50 (e.g., the position of the plane shape I50, or more specifically the parameter associated with the central position).

The image processing apparatus 10 with the above structure sets, as the provisional center PP1 (provisional parameter), a value or a range of values estimated using the edge extraction area SA1 designated by the user as the area including the outline E51 of the plane shape I50, and/or a value or a range of values designated by the user as the parameter associated with the position of the plane shape I50 (e.g., the central position). For example, the image processing apparatus 10 narrows down the calculated values as candidates for evaluation (testing) performed using the detection points D51 to Dn based on the provisional center PP1 set by using the edge extraction area SA1 that is intuitively designated by the user as the area including the outline E51 of the plane shape I50. The image processing apparatus 10 thus incorporates intuitive processing performed by the user into the automatic (or specifically geometric or algebraic) processing for evaluating the calculated values. The image processing apparatus 10 thus has high robustness against abnormal detection points caused by measurement errors and the surrounding noise, and achieves both high accuracy estimation and high-speed estimation processing. The evaluation (testing) performed using the detection points D51 to Dn refers to, for example, the evaluation using the number of support points (inliers) and/or the sum of deviation distances.

The image processing apparatus 10 described above, which estimates the central position of the plane shape I50, or a substantially circular shape with radius r, will now be summarized.

When the hypothesis calculation unit 12 in the image processing apparatus 10 calculates a plurality of calculated values (e.g., the points H1 and H2) using one combination of selection points (e.g., the combination of points D52 and D54), the hypothesis extraction unit 16 extracts, from the plurality of calculated values, one calculated value (e.g., the point H1) whose relevance to the provisional center PP1 (provisional parameter) falls within the predetermined range.

When the points H1 and H2 are calculated using the combination of points D52 and D54, the image processing apparatus 10 with the above structure extracts only the point H1 from the points H1 and H2. The image processing apparatus 10 can thus output the best-possible result that can be estimated from the group of detection points by eliminating the effect of hypotheses with low accuracy.

In the present embodiment, the image processing apparatus 10 estimates the parameter defining the plane shape I50, which is the central position of the substantially circular plane shape I50. The hypothesis calculation unit 12 calculates the intersections of two circles with a predetermined radius (or radius r) and each having one of the two selection points as the center (the points H1 and H2) for each combination of two selection points on the outline E51 of the plane shape I50 (e.g., the combination of points D52 and D54) as the calculated value for the central position. When the hypothesis calculation unit 12 obtains two intersections (the points H1 and H2) using the two selection points (or the points D52 and D54), the hypothesis extraction unit 16 extracts, as the calculated value for the central position corresponding to the two selection points, one of the two intersections with the shorter distance to the provisional center PP1 (provisional central position) set as the provisional parameter of the central position, or an intersection included in the provisional central area extracted from the two intersections and set as the provisional parameter of the central position.

When two calculated values (points H1 and H2) are obtained using the two selection points (or the points D52 and D54), the image processing apparatus 10 with the above structure extracts one of the calculated values (e.g., the point H1) based on the provisional center PP1 or the provisional central area as the candidate for evaluation (testing) performed using the detection points D51 to Dn. When, for example, the number of detection points D51 to Dn is N, $_N C_2$ combinations are available for selecting two selection points (e.g., the points D52 and D54) from the N detection points D51 to Dn. When two calculated values (e.g., the points H1 and H2) are obtained using each of the $_N C_2$ combinations and the extraction using the provisional center PP1 or the provisional central area is not performed, the $2*_N C_2$ calculated values are to be evaluated (tested) using the N detection points D51 to Dn. The image processing apparatus 10 extracts calculated values based on the provisional center PP1 or the provisional central area, and evaluates the half of the calculated values to be evaluated without the extraction, or specifically evaluates the $_N C_2$ calculated values, to determine the central position of the plane shape I50. In other words, the image processing apparatus 10 extracts a calculated value as the candidate for evaluation based on the provisional center PP1 or the provisional central area. The image processing apparatus 10 thus has high robustness against abnormal detection points caused by measurement errors and the surrounding noise, and achieves both high accuracy estimation and high-speed estimation processing.

The plane shape I50 (substantially circular shape) or specifically the captured image of the object to undergo position detection (or positioning) having the predetermined radius (radius r) refers to the plane shape I50 or the image having the object size predetermined by the specifications or design.

Using Provisional Center

The image processing apparatus 10 can use the provisional parameter (the provisional center PP1 or the provisional center area) in the manner described below. When a plurality of calculated values are calculated from one combination of selection points (e.g., the combination of selection points D52 and D54) (e.g., when the points H1 and H2 are calculated), the image processing apparatus 10 first extracts, as a candidate for evaluation (testing), one of the calculated values nearer the provisional center PP1, or one of the calculated values included in the provisional center area. The image processing apparatus 10 then eliminates, from the candidates for evaluation (testing), the calculated value that deviates from the provisional center PP1 by at least a predetermined value. The image processing apparatus 10 then eliminates, in advance, any combination of selection points predicted to yield a calculated value deviating from the provisional center PP1 by at least the predetermined value, before extracting combinations of selection points. The structure of the image processing apparatus 10, which uses the provisional parameter (the provisional center PP1 or the provisional center area) as described above, will now be described in detail.

Block Diagram of Image Processing Apparatus

The image processing apparatus 10 includes the image obtaining unit 11, the hypothesis calculation unit 12, the hypothesis testing unit 13, a user operation receiving unit 14, the provisional value setting unit 15, and the hypothesis extraction unit 16. As described later, typical hypothesis testing position detection apparatuses known in the art include components that are the same as the image obtaining unit 11, the hypothesis calculation unit 12, and the hypothesis testing unit 13. The image processing apparatus 10 includes, in addition to the same components as such typical hypothesis testing position detection apparatuses, the user operation receiving unit 14, the provisional value setting unit 15, and the hypothesis extraction unit 16. The image processing apparatus 10 may not include the user operation receiving unit 14. When the provisional value setting unit 15 sets the provisional parameter without receiving a user operation, the image processing apparatus 10 may eliminate the user operation receiving unit 14. This will be described in detail later.

The image obtaining unit 11 obtains image data including a captured image of an object (e.g., a disc substrate such as a semiconductor wafer) for which the parameter associated with the position is to be determined from the imaging apparatus 20, or more specifically, image data including the plane shape I50 of the object. The image obtaining unit 11 transmits the obtained image data to the hypothesis calculation unit 12 and the provisional value setting unit 15.

The hypothesis calculation unit 12 obtains, using each combination of selection points selected from the detection points D51 to Dn on the outline E51 of the plane shape I50, which is image data obtained by the image obtaining unit 11 (e.g., the combination of points D52 and D54), a calculated value for the parameter associated with the position of the plane shape I50 (e.g., the central position of the plane shape I50).

The hypothesis testing unit 13 determines, as an estimated value for the parameter associated with the position of the plane shape I50, a calculated value with the highest evaluation from the calculated values obtained by the hypothesis calculation unit 12 using the detection points D51 to Dn (in particular, the detection points D51 to Dn other than the above selection points). The hypothesis testing unit 13 determines, from the calculated values, a calculated value with, for example, the largest number of detection points D51 to Dn that are located within a predetermined distance from the outline E51 of the plane shape I50 estimated using the calculated values (in particular, the detection points D51 to Dn other than the selection points) as the estimated value. The hypothesis testing unit 13 may also determine, as the above estimated value, a calculated value with, for example, the smallest sum of distances from the outline of the plane shape estimated using the calculated values (e.g., the above hypothesis circle) to each of the detection points D51 to Dn (in particular, the detection points D51 to Dn other than the selection points) extracted from the calculated values.

The hypothesis testing unit 13 in the image processing apparatus 10 determines, from the calculated values calculated by the hypothesis calculation unit 12, particularly from the calculated values extracted by the hypothesis extraction unit 16, a calculated value with the highest evaluation performed using the detection points D51 to Dn as the estimated value for the parameter associated with the position of the plane shape I50.

The hypothesis testing fitting apparatuses (hypothesis testing position detection apparatuses) known in the art are also capable of obtaining a captured image of an object (plane shape I50) (the main capability of the image obtaining unit 11), calculating a value for the parameter associated with the position of the plane shape I50 using each combination of selection points (the main capability of the hypothesis calculation unit 12), and evaluating (testing) the calculated value (the main capability of the hypothesis testing unit 131). The image processing apparatus 10 may thus include the image obtaining unit 11, the hypothesis calculation unit 12, and the hypothesis testing unit 13 that are the same as the corresponding components included in such hypothesis testing position detection apparatuses known in the art. In other words, the image processing apparatus 10 has the same structure as such hypothesis testing position detection apparatuses known in the art except that the image processing apparatus 10 additionally includes the provisional value setting unit 15 and the hypothesis extraction unit 16 (and further the user operation receiving unit 14 as appropriate). The image processing apparatus 10 can thus reduce the manufacturing cost by using the structure of the hypothesis testing position detection apparatuses known in the art.

The user operation receiving unit 14 receives, from the imaging apparatus 20, an operation performed by the user on image data including the plane shape I50 (a user operation), and transmits the received user operation (more precisely, the user operation and information indicating the shape parameter estimated using the user operation, which is for example the center of the edge extraction area SA1 or the radius) to the provisional value setting unit 15. The user operation receiving unit 14 receives, for example, a user operation designating the edge extraction area SA1 in the captured image including the plane shape I50, and transmits the received user operation to the provisional value setting unit 15. When the provisional value setting unit 15 sets the provisional parameter without using the parameter associated with the position of the plane shape I50 designated by the user with a predetermined method, the user operation receiving unit 14 may be eliminated.

The provisional value setting unit 15 sets the provisional parameter (e.g., the provisional center PP1), which is a value or a range of values estimated for the parameter associated with the position of the plane shape I50 with a method different from the calculation method used by the hypothesis calculation unit 12 to calculate the values.

For example, the provisional value setting unit 15 sets, as the provisional center PP1 (the provisional parameter), a value or a range of values estimated using the edge extraction area SA1 designated by the user as an area including the outline E51 of the plane shape I50, and/or a value designated by the user as the parameter associated with the position of the plane shape I50 (e.g., the central position).

When setting the provisional parameter using the parameter associated with the position of the plane shape I50 designated by the user with the predetermined method, the provisional value setting unit 15 obtains the parameter designated by the user with the predetermined method from the user operation receiving unit 14. For example, the provisional value setting unit 15 obtains, from the user operation receiving unit 14, a user operation for setting the edge extraction area SA1 and the lines (the number of lines) as described with reference to FIG. 4.

However, the provisional value setting unit 15 may set the provisional parameter without using the parameter associated with the position of the plane shape I50 designated by the user with the predetermined method. The provisional value setting unit 15 may set, as the provisional parameter (the provisional center PP1), a calculated value with a simpler position estimation method such as the method described with reference to FIGS. 5A and 5B, the method using the features of a workpiece, Hough transform, or the least square method. The method for setting the provisional parameter is described above and will not be described repeatedly.

The hypothesis extraction unit 16 extracts, from the plurality of values calculated by the hypothesis calculation unit 12, one or more calculated values whose relevance to the provisional parameter set by the provisional value setting unit 15 falls within the predetermined range. The hypothesis extraction unit 16 transmits the extracted values to the hypothesis testing unit 13. The method for extracting such calculated values using the provisional parameter (e.g., the provisional center PP1) is described above, and will not be described repeatedly.

Flowchart of Image Processing Apparatus

Figure 6:
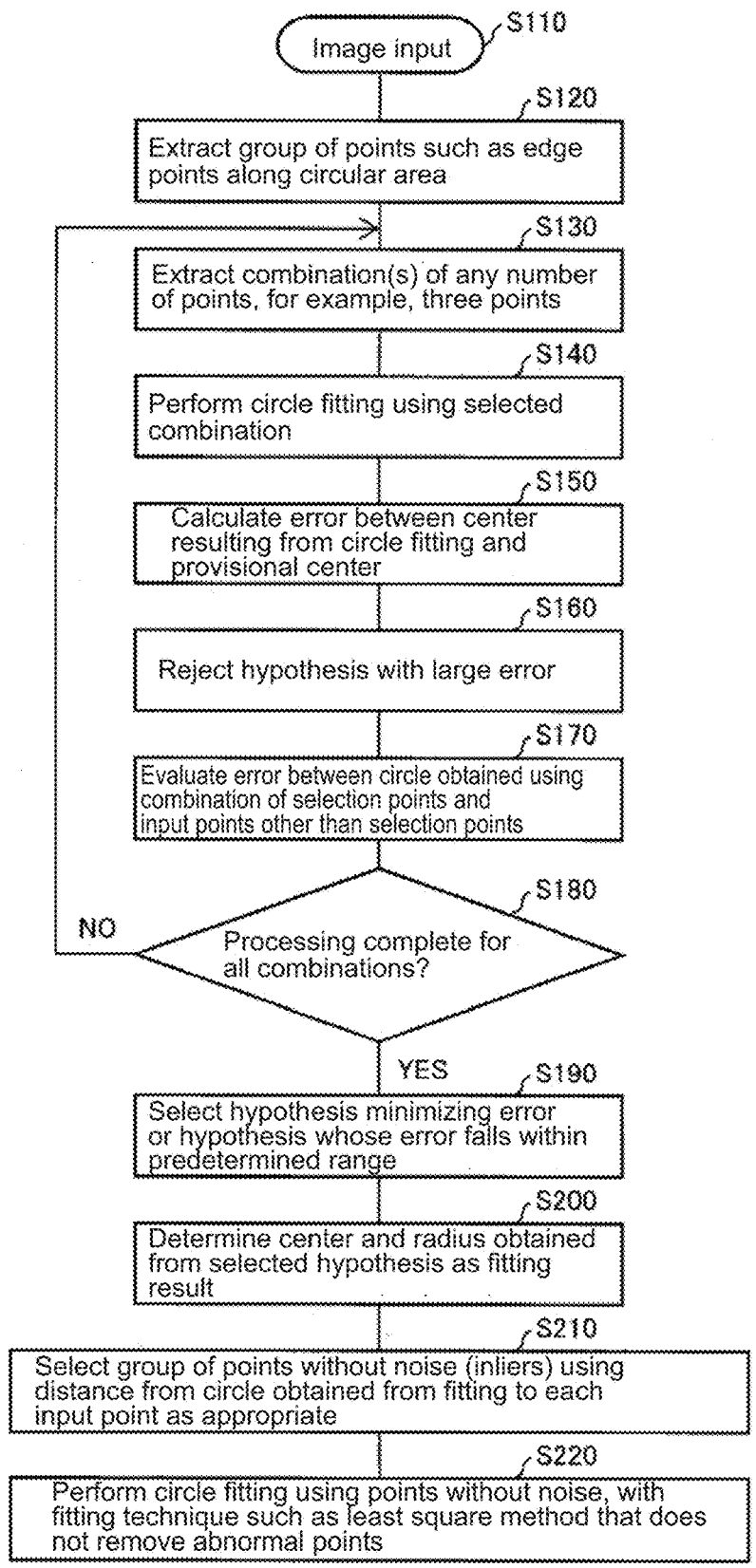
FIG. 6 is a flowchart showing the processing performed by the image processing apparatus to determine the central position of the (substantially) circular shape shown in FIG. 2.

FIG. 6 is a flowchart showing the processing performed by the image processing apparatus 10 to determine the central position of the plane shape I50.

As shown in FIG. 6, when the image obtaining unit 11 receives the input image data including the plane shape I50 (image input: S110), the hypothesis calculation unit 12 extracts the detection points D51 to Dn (a group of points such as edge points) along the outline E51 of the plane shape I50 (circular area) (S120). The hypothesis calculation unit 12 extracts one or more combinations of selection points (any number of points) (e.g., the combination of points D52 and D54) (S130). When the plane shape I50 is a substantially circular shape with a fixed radius (or a known radius), the hypothesis calculation unit 12 may extract two selection points. When the plane shape I50 has an unknown radius, the hypothesis calculation unit 12 may extract three selection points.

The hypothesis calculation unit 12 performs circle fitting using the extracted (selected) combination of selection points (e.g., the combination of points D52 and D54 shown in FIG. 3) (S140). More specifically, the hypothesis calculation unit 12 calculates, using the combination of selection points (e.g., the combination of points D52 and D54), the calculated values (e.g., the points H1 and H2) corresponding to the combination of selection points.

The hypothesis extraction unit 16 calculates an error between the center resulting from the circle fitting, which is each of the values calculated by the hypothesis calculation unit 12 (or the points H1 and H2), and the provisional center PP1 (provisional parameter) set by the provisional value setting unit 15 (S150). The hypothesis extraction unit 16 rejects any hypothesis with a large error from the provisional center PP1 (the point H2 as the calculated value) (S160).

The hypothesis testing unit 13 calculates an error between a hypothesis circle with radius r and having the calculated value that has not been rejected in step S160 (the point H1) as the center (e.g., the hypothesis circle H1L (D52, D54) shown in FIGS. 2 and 3), which is a circle obtained using the combination of selection points (e.g., the combination of points D52 and D54), and the detection points D51 to Dn (input points) other than the selection points (S170). The hypothesis testing unit 13 determines whether the processing in steps S130 to S170 has been complete for all the combinations of selection points (S180). When detecting any combination of selection points for which the processing in steps S130 to S170 has not been complete (No in step S180), the hypothesis testing unit 13 performs the processing from step S130 and subsequent steps for the detected combination.

When determining that the processing in steps S130 to S170 has been complete for all the combinations of selection points (Yes in step S180), the hypothesis testing unit 13 selects a calculated value (hypothesis) that minimizes the error calculated in step S170, or selects a calculated value (hypothesis) whose error falls within a predetermined range (S190). The hypothesis testing unit 13 then determines the center (and the radius) obtained from the hypothesis selected in step S190 as an estimated value, or as the fitting result (S200).

The image processing apparatus 10 may select a group of points without noise (inliers) using the distance from the circle resulting from the fitting to each input point (each detection point) as appropriate (S210), and then may perform the circle fitting using the selected points without noise. The image processing apparatus 10 may also use a fitting technique such as the least square method, which does not remove abnormal points (S220).

The position detection method used by the image processing apparatus 10 described with reference to FIG. 6 will now be summarized. The position detection method used by the image processing apparatus 10 includes a calculation process (S140), an extraction process (S150 and S160), and a determination process (S190 and S200). In the calculation process (S140), the image processing apparatus 10 calculates a plurality of values for the parameter defining the plane shape I50 (e.g., the points H1 and H2) using each combination of selection points selected from the plurality of detection points D51 to Dn (e.g., the combination of points D52 and D54) for the plane shape I50 (obtained as image data for example). In the extraction process (S150 and S160), the image processing apparatus 10 extracts, from the plurality of values calculated in the calculation process (e.g., the points H1 and H2), a calculated value whose relevance to the provisional parameter (e.g., the provisional center PP1) falls within a predetermined range (e.g., the point H1). The provisional parameter is a value or a range of values estimated for the parameter defining the plane shape I50 with a method different from the calculation method for calculating the values in the calculation process. In the determination process (S190 and S200), the image processing apparatus 10 determines, from the calculated values extracted in the extraction process, a calculated value with the highest evaluation performed using the detection points D51 to Dn as an estimated value for the parameter defining the plane shape I50.

Second Embodiment

A second embodiment of the present invention will now be described in detail with reference to FIGS. 7 and 8. The image processing apparatus 10 described above estimates the parameter associated with the position for a plane shape, or specifically the plane shape I50, which is a substantially circular shape, and estimates the central position as the parameter associated with the position. However, the shape for which the parameter associated with the position is estimated may not be a substantially circular plane shape, and the parameter associated with the position may not be the central position. In the second embodiment, a method used by the image processing apparatus 10 to estimate an outline (a quadratic curve) of a plane shape I60 including a quadratic curve in its outline (edge) will be described.

The outline of the plane shape I60 assuming no rotation can be written by the simple quadratic curve equation: $ax^2+bx+c+y=0$. Two selection points ($X_1$ and $Y_1$) and ($X_2$ and $Y_2$) are substituted into the equation, which is transformed into the equation $(X_1^2-X_2^2)a+(X_1-X_2)b=Y_2-Y_1$. In this equation, the coefficients (a, b) are on a straight line, and have infinite solutions. In this case, the coefficients (a, b, and c) cannot be uniquely specified even with this method (the method using the provisional parameter).

A combination of three selection points (combination of three or more selection points) can be used to uniquely specify the coefficients (a, b, and c). However, when three (or more) selection points are near one another, the resultant solution (specified values a, b, and c) can have extremely low accuracy as described below with reference to FIG. 7. Such low accuracy may be overcome by, for example, avoiding selecting three selection points that are near one another. However, when the object shape (e.g., the plane shape I60) is obtained partially, or when the points are not near one another but have much noise, the accuracy can decrease. The image processing apparatus 10 eliminates a hypothesis with a large difference from the provisional parameter (a hypothesis greatly deviating from the provisional parameter) to prevent fitting to values that greatly deviate from values intended by the user when the object shape is obtained partially or when the points are not near one another and have much noise. This will be described below with reference to FIG. 7.

Figure 7:
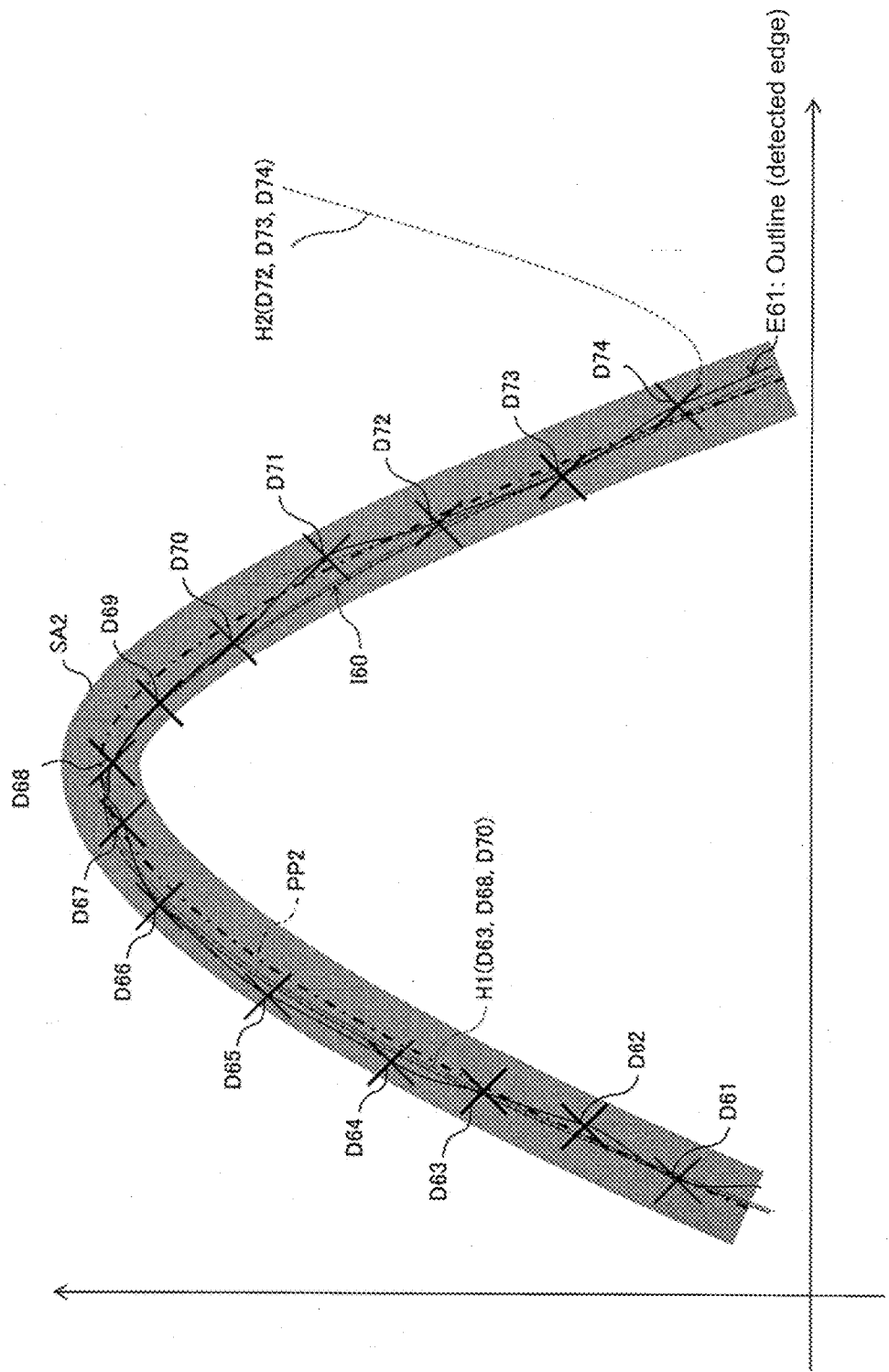
FIG. 7 is a diagram describing a method with which the image processing apparatus according to the second embodiment of the present invention extracts one of the two calculated values (hypotheses) for a quadratic curve included in an edge of a two-dimensional (2D) shape using a provisional parameter.

FIG. 7 shows an example in which the coefficients (a, b, and c) are uniquely specified by using a combination of three selection points. The method described below with reference to FIG. 7 also allows calculation of the outline of the plane shape I60 involving typical rotations.

FIG. 7 is a diagram describing a method with which the image processing apparatus 10 according to the second embodiment extracts one (e.g., the calculated value H1) of the two calculated values H1 (D63, D68, and D70) and H2 (D72, D73, and D74) for a quadratic curve included in an outline E61 of the plane shape I60 (edge) using a provisional parameter PP2. More precisely, a curve PP2 in FIG. 7 is drawn using the provisional parameter PP2. The provisional parameter is expressed using the coefficients (a, b, and c) included in the equation $ax^2+bx+c+y=0$ or is a value calculated using the coefficients (a, b, and c) (e.g., a focus position).

As shown in FIG. 7, the hypothesis calculation unit 12 calculates, using each combination of selection points selected from the plurality of detection points D61, D62, to Dn (D61 to Dn) on the outline E61 of the plane shape I60, the calculated values H1 and H2 for the quadratic curve included in the outline E61 of the plane shape I60. In FIG. 7, the value H1 is calculated using the combination of three selection points D63, D68, and D70, whereas the value H2 is calculated using the combination of three selection points D72, D73, and D74.

When the three selection points are near one another, or when, for example, the detection points D72, D73, and D74 near one another are selected, the value H2 calculated using the combination of three detection points D72, D73, and D74 greatly deviates from the outline of the plane shape I60 as shown in FIG. 7. To exclude a hypothesis greatly deviating from the user's intention (the calculated value H2) calculated using the combination of three selection points D72, D73, and D74 that are near one another from the candidate for testing by the hypothesis testing unit 13, the image processing apparatus 10 uses the provisional parameter PP2 set by the provisional value setting unit 15.

The provisional value setting unit 15 sets (calculates) the provisional parameter PP2 as a value or a range of values estimated using an edge extraction area SA2 designated by the user as an area including the outline E61 of the plane shape I60. More specifically, the provisional value setting unit 15 calculates the provisional parameter PP2 as a value or a range of values estimated for the quadratic curve included in the outline E61 of the plane shape I60 with a method different from the calculation method used by the hypothesis calculation unit 12 to calculate the values H1 and H2.

In the example shown in FIG. 7, the provisional parameter PP2 (more precisely, a curve drawn using the provisional parameter PP2) is a curve extending through the center of the edge extraction area SA2 (an area set by the user), which is a parabola with a predetermined width. In FIG. 7, the curve drawn using the provisional parameter PP2 is indicated by an alternate long and short dash line. The curve drawn using the provisional parameter PP2 may not be the curve extending through the center of the edge extraction area SA2, which is the parabola with the predetermined width set by the user. The provisional value setting unit 15 may set the provisional parameter PP2 with another method. For example, the provisional value setting unit 15 may calculate a focus of the quadratic curve representing the outline E61 in advance, and then set the focus as the provisional central position (the provisional parameter PP2). More specifically, the provisional parameter PP2 may be calculated by the provisional value setting unit 15 as a value or a range of values estimated for the quadratic curve included in the outline E61 of the plane shape I60 with a method different from the calculation method used by the hypothesis calculation unit 12 to calculate the values H1 and H2.

The hypothesis extraction unit 16 extracts, from the calculated values H1 and H2 calculated by the hypothesis calculation unit 12, only the calculated value H1 whose relevance to the provisional parameter PP2 set by the provisional value setting unit 15 falls within the predetermined range. More specifically, the hypothesis extraction unit 16 extracts, from the calculated values H1 and H2, only the calculated value H1, which is nearer the provisional parameter PP2.

The hypothesis testing unit 13 determines, from the calculated values extracted by the hypothesis extraction unit 16 (e.g., the calculated value H1), the calculated value with the highest evaluation performed using the plurality of detection points D61 to Dn as an estimated value for the parameter associated with the position of the plane shape I60.

Method for Setting and Using Provisional Parameter

In the same manner as in the first embodiment, the provisional value setting unit 15 sets (calculates) the provisional parameter PP2 with, for example, the method described below. More specifically, the provisional value setting unit 15 sets (calculates) the provisional parameter PP2 based on a user operation directly designating the parameter associated with the position corresponding to the calculated value obtained by the hypothesis calculation unit 12.

More specifically, when the plane shape I60 is a substantially circular shape or a substantially elliptical shape, the provisional value setting unit 15 sets the provisional parameter PP2 for the central coordinate value of the substantially circular shape or the substantially elliptical shape or for the radius (or the minor axis or the major axis of an ellipse) using a numerical value directly input by the user or a value input by the user clicking on the screen. The provisional value setting unit 15 may also estimate an approximate position, radius, and direction based on a user operation designating an edge extraction area or the direction of the center (by, for example, clicking on the screen), and then may set the provisional parameter PP2. In this case, the central position of the plane shape can greatly deviate from the screen. The provisional value setting unit 15 may thus set the provisional parameter PP2 associated with the central position based on only the direction of an approximate central position designated by the user. As described above, the provisional value setting unit 15 may set the provisional parameter PP2 based on a user operation selecting the direction of the central position of the circle from selection items such as the upper right, lower right, upper left, or lower left on the screen. The provisional value setting unit 15 may set the provisional parameter PP2 for a straight line included in the outline E61 of the plane shape I60 using a user operation directly inputting the angle, the intercept, or a point on which the straight line passes. The provisional value setting unit 15 may set the provisional parameter PP2 associated with a quadratic curve or a parabola included in the outline E61 of the plane shape I60 using a user operation selecting whether the quadratic curve or the parabola opens upward or downward, or a user operation selecting or inputting the point near the vertex of the quadratic curve or the parabola. When the plane shape I60 is a complex shape such as a rectangular shape, the provisional value setting unit 15 may set the provisional parameter PP2 associated with the position of the plane shape I60 as a point near the intersection of the diagonal lines of the complex shape such as the rectangular shape using the coordinates directly input by the user or a user operation performed by, for example, clicking on the screen. When the outline E61 of the plane shape I60 includes a curve written by a polynomial (a straight line), the provisional value setting unit 15 may set the provisional parameter PP2 associated with the position of the plane shape I60 as a point near the point on which the line represented by the polynomial passes using the coordinates directly input by the user or a user operation performed by, for example, clicking on the screen.

The provisional value setting unit 15 also sets (calculates) the provisional parameter PP2 based on a user operation indirectly designating the parameter associated with the position corresponding to the calculated value obtained by the hypothesis calculation unit 12 in the same manner as the provisional value setting unit 15 setting the provisional parameter PP2 using the edge extraction area SA2. More specifically, the provisional value setting unit 15 sets the provisional parameter PP2 using an edge extraction area, or in particular, the parameter for setting the edge extraction area designated by the user, which is used by the image processing apparatus 10 to detect the outline E61 of the plane shape I60.

The provisional value setting unit 15 may further set an estimated value estimated by another processing unit (function) or a sensor as a provisional parameter PP12 associated with the position of the plane shape I60. The provisional value setting unit 15 sets the provisional parameter PP2 using the result from rough extraction of the plane shape I60 performed by the other processing unit (function) or the sensor, or using the central position obtained based on the apparatus design for the plane shape I60 (more precisely, an object with the plane shape I60). The image processing apparatus 10 may also set a value calculated with a method different from the method used by the hypothesis calculation unit 12 to calculate the values H1 and H2 using the combination of points D62 and D66 (e.g., a simpler position estimation method such as Hough transform or the least square method).

The image processing apparatus 10 can use the provisional parameter PP2 calculated (set) with the method described above for the purpose described below. When a plurality of calculated values are calculated using one combination of selection points (in other words, when the calculated values are not uniquely specified), the image processing apparatus 10 selects one of the calculated values nearer the provisional parameter PP2 as the calculated value corresponding to this combination of selection points. The image processing apparatus 10 may also reject the calculated values that deviate from the provisional parameter PP2 by at least a predetermined value. The image processing apparatus 10 may further sample a group of points (combinations of selection points) excluding any combination of selection points predicted to greatly deviate from the provisional parameter PP2 in advance based on the point series for example.

To detect the detection points D61, D62, to D74, the edge E61 may not be detected. The edge E61 may not be detected across all the pixels in the image. More specifically, the detection points D61, D62, to D74 can be directly obtained by setting scanlines SL61 to SL74 (not shown) in the edge extraction area SA2, and then searching for a maximum edge on the scanlines SL61 to SL74. In other words, for example, the detection points D61, D62, to D74 can be detected by searching for the edge E61 on the scanlines SL61, SL62, and SL74. More specifically, the detection point D61 may be detected on the scanline SL61, and the detection point D62 may be detected on the scanline SL62. In this case, the edge E61 may not be detected (may not be detected through image recognition).

The processing described with reference to FIG. 7 will now be summarized. The outline of the plane shape I60 (quadratic curve) whose outline (edge) includes a quadratic curve (e.g., $ax^2+bx+c+y=0$) can be estimated using three or more selection points (or five selection points when the outline of the plane shape I60 involves typical rotations under the assumption that A is not 0 in the equation $Ax^2+By^2+Cxy+Dx+Ey+F=0$). However, when the selection points are near one another, each hypothesis calculated using the combination of selection points (the calculated value such as the combination of values (a and b) can have low accuracy.

The image processing apparatus 10 uses the provisional parameter to exclude hypotheses (calculated values) obtained using three selection points near one another, or more specifically hypotheses (calculated value) greatly deviating from the user's intention, from the candidates for testing by the hypothesis testing unit 13. More specifically, the image processing apparatus 10 rejects hypotheses (calculated values) greatly deviating from the provisional parameter (deviating from the provisional parameter by at least a predetermined value) to narrow down the candidates for testing by the hypothesis testing unit 13.

As shown in FIG. 7, for example, the image processing apparatus 10 can use, as the provisional parameter, an edge extraction area SA2 that is a parabola with a predetermined width set by the user. The edge extraction area SA2 is an arch area with a predetermined width, and may include the vertex of a quadratic curve representing the outline.

The image processing apparatus 10 may calculate, for example, a focus of a quadratic curve representing the outline, and then use the focus as the provisional central position (provisional parameter). The image processing apparatus 10 may obtain the focus of the parabola (used as the calculated center) calculated using any combination of selection points (e.g., three selection points). When an error between the provisional central position and the calculated center is at least a predetermined value, the image processing apparatus 10 may reject a hypothesis corresponding to the calculated center (a parabola represented by the calculated value obtained using the combination of selection points).

Figure 8:
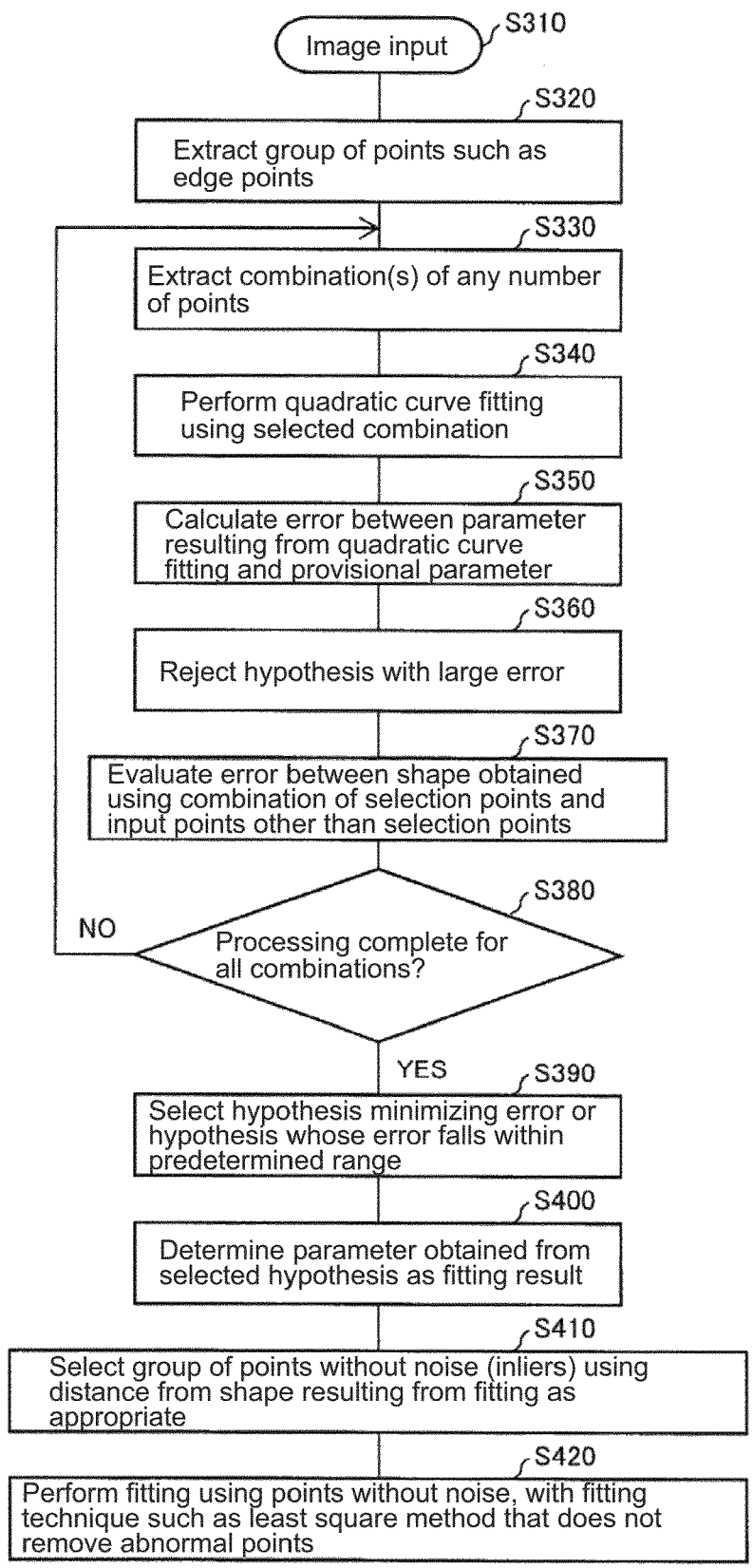
FIG. 8 is a flowchart showing the processing performed by the image processing apparatus to determine a quadratic curve included in the edge of the plane shape shown in FIG. 7.

FIG. 8 is a flowchart showing the processing performed by the image processing apparatus 10 to determine a quadratic curve included in the edge of the plane shape shown in FIG. 7.

As shown in FIG. 8, when the image obtaining unit 11 receives the input image data including the plane shape I60 (image input: S310), the hypothesis calculation unit 12 extracts the detection points D61 to Dn (a group of points such as edge points) along the outline E61 of the plane shape I60 (edge area) (S320). The hypothesis calculation unit 12 extracts one or more combinations of selection points (any number of points) (e.g., the combination of points D62 and D66) (S330).

The hypothesis calculation unit 12 performs quadratic curve fitting (shape fitting) using the extracted (selected) combination of selection points (e.g., the combination of points D62 and D66 shown in FIG. 7) (S340). More specifically, the hypothesis calculation unit 12 calculates, using the combination of selection points (e.g., the combination of points D62 and D66), the calculated value corresponding to the combination of selection points (e.g., the calculated value H1 for the points D62 and D66 and the calculated value H2 for the points D62 and D66).

The hypothesis extraction unit 16 calculates an error between the parameter resulting from the quadratic curve fitting (shape fitting) (e.g., a quadratic curve included in the outline E61 of the plane shape I60), which is each of the calculated values H1 and H2 obtained by the hypothesis calculation unit 12, and the provisional parameter PP2 set by the provisional value setting unit 15 (S350). The hypothesis extraction unit 16 rejects any hypothesis with a large error from the provisional parameter PP2 (the calculated value H2) (S360).

The hypothesis testing unit 13 calculates (evaluates) an error between the calculated value H1 that has not been rejected in step S360 and each of the detection points D61 to Dn (input points) other than the selection points (the points D62 and D66) (S370). The hypothesis testing unit 13 determines whether the processing in steps S330 to S370 has been complete for all the combinations of selection points (S380). When detecting any combination of selection points for which the processing in steps S330 to S370 has not been complete (No in step S380), the hypothesis testing unit 13 performs the processing from step S330 and subsequent steps for the detected combination.

When determining that the processing in steps S330 to S370 has been complete for all the combinations of selection points (Yes in step S380), the hypothesis testing unit 13 selects a calculated value (hypothesis) that minimizes the error calculated in step S370, or selects a calculated value (hypothesis) whose error falls within a predetermined range (S390). The hypothesis testing unit 13 then determines the calculated value selected in step S390 as the estimated value, or as the fitting result (S400).

The image processing apparatus 10 may select a group of points without noise (inliers) using the distance from the shape resulting from the fitting as appropriate (S410), and then may perform the fitting using the selected points without noise. The image processing apparatus 10 may also use a fitting technique such as the least square method, which does not remove abnormal points (S420).

The position detection method used by the image processing apparatus 10 described with reference to FIG. 8 will now be summarized. The position detection method used by the image processing apparatus 10 includes a calculation process (S340), an extraction process (S350 and S360), and a determination process (S390 and S400). In the calculation process (S340), the image processing apparatus 10 calculates a plurality of values (e.g., the calculated values H1 and H2) for the parameter defining the plane shape I60 (e.g., the parameter associated with the position of the plane shape I60) using each combination of selection points (e.g., the combination of D62 and D66) selected from the plurality of detection points D61 to Dn (e.g., the plurality of detection points D61 to Dn on the outline E61 of the plane shape I60) for the plane shape I60 (obtained as image data for example). In the extraction process (S350 and S360), the image processing apparatus 10 extracts, from the plurality of values obtained in the calculation process (e.g., the calculated values H1 and H2), a calculated value whose relevance to the provisional parameter PP2 falls within the predetermined range (e.g., the calculated value H1). The provisional parameter PP2 is a value or a range of values estimated for the parameter defining the plane shape I60 with a method different from the calculation method used to calculate the values in the calculation process (e.g., the parameter associated with the position of the plane shape I60, or a quadratic curve included in the outline E61). In the determination process (S390 and S400), the image processing apparatus 10 determines, from the calculated values extracted in the extraction process, a calculated value with the highest evaluation performed using the detection points D61 to Dn as an estimated value for the parameter defining the plane shape I60 (e.g., the parameter associated with the position of the plane shape I60).

Third Embodiment

Each functional block of the image processing apparatus 10 (in particular, the image obtaining unit 11, the hypothesis calculation unit 12, the hypothesis testing unit 13, the user operation receiving unit 14, the provisional value setting unit 15, and the hypothesis extraction unit 16) may be implemented using a logic circuit (hardware), such as an integrated circuit (IC chip), or using software implemented by a central processing unit (CPU).

When the functional blocks are implemented using software, the image processing apparatus 10 includes a CPU, which executes instructions included in a program or software to implement these functions, a read only memory (ROM) or a memory device (hereinafter referred to as a storage medium), which stores the program and various pieces of data readable by a computer (or by the CPU), and a random access memory (RAM), into which the program is expanded. The computer (or CPU) reads the program from the storage medium, and executes the program to achieve one or more aspects of the present invention. The storage medium may be a non-transitory tangible medium, such as a tape, a disk, a card, a semiconductor memory, or a programmable logic circuit. The program may be provided via any transmission medium that can transmit the program to the computer (such as a communication network or a broadcast wave). One or more embodiments of the present invention may be implemented using programs that are electronically transmitted in the form of data signals carried by carrier waves.

The embodiments disclosed herein should not be construed to be restrictive, but may be modified within the spirit and scope of the claimed invention. The technical features disclosed in different embodiments may be combined in other embodiments within the technical scope of the invention.

REFERENCE SIGNS LIST 10 image processing apparatus (position detection apparatus)
12 hypothesis calculation unit (calculation unit)
13 hypothesis testing unit (determination unit)
15 provisional value setting unit (setting unit)
16 hypothesis extraction unit (extraction unit)
I50 plane shape (shape, substantially circular shape)
E51 outline
D51 to Dn detection point
D52 selection point
D54 selection point
I60 plane shape
E61 outline
D61 to Dn detection point
D62 selection point
D66 selection point
H1 calculated value
H2 calculated value
PP1 provisional center (provisional parameter)
PP2 provisional parameter
r predetermined radius
S53 notch
SA1 edge extraction area (area designated by the user as an area indicating the outline of the plane shape)
SA2 edge extraction area (area designated by the user as an area indicating the outline of the plane shape)
S140 calculation process
S150, S160 extraction processes
S190, S200 determination processes
S340 calculation process
S350, S360 extraction processes
S390, S400 determination processes

The invention claimed is:

1. A position detection apparatus comprising a processor configured with a program to perform operations comprising:
   operation as an image obtaining unit configured to obtain a shape;
   operation as a provisional value setting unit configured to set a provisional parameter comprising an estimated value for a parameter associated with the shape;
   operation as a calculation unit configured to:
      extract a plurality of detection points associated with the shape;
      select, from the detection points, one or more combinations of selection points;
      generate a plurality of hypothesis shapes based on the one or more combinations of selection points; and
      calculate a plurality of potential values for the parameter, each potential value of the plurality of potential values corresponding to at least one of the plurality of hypothesis shapes;
   operation as an extraction unit configured to extract, from the plurality of potential values calculated by the calculation unit, one or more of the plurality of potential values having an error relative to the provisional parameter that falls within a predetermined range; and
   operation as a determination unit configured to determine, from the one or more of the plurality of potential values extracted by the extraction unit, a potential value with a smallest error as a final estimated value for the parameter.

2. The position detection apparatus according to claim 1, wherein
   the shape comprises a captured image or a measurement value of an object for which the parameter is to be determined by the position detection apparatus.

3. The position detection apparatus according to claim 1, wherein
   the processor is further configured with the program to perform operations such that operation as the determination unit comprises operation as the determination unit that determines, from the one or more of the plurality of potential values extracted by the extraction unit, the final estimated value for the parameter using a number of the plurality of detection points located within a predetermined distance from the shape estimated using the plurality of potential values or a sum of distances to each of the detection points from the shape estimated using the plurality of potential values.

4. The position detection apparatus according to claim 1, wherein the processor is further configured with the program to perform operations such that operation as the provisional value setting unit configured to set the provisional parameter comprising an estimated value for the parameter associated with the shape comprises operation as the provisional value setting unit configured to set the provisional parameter using an area designated as an area including an outline of the shape, or a value designated as an approximate value of the parameter.

5. The position detection apparatus according to claim 1, wherein
   the processor is further configured with the program to perform operations such that when the processor, operating as the calculation unit, calculates the plurality of potential values using one of the hypothesis shapes, the processor, operating as the extraction unit extracts, from the plurality of potential values, one of the plurality of potential values whose error relative to the provisional parameter falls within the predetermined range.

6. The position detection apparatus according to claim 1, wherein
   the parameter is a central position of a substantially circular shape,
   the processor is further configured with the program to perform operations such that operation as the calculation unit comprises operation as the calculation unit that calculates intersections of two of the plurality of hypothesis shapes with a predetermined radius, each having a different one of the selection points as a center, as at least one value for the central position; and
   when the processor, operating as the calculation unit, obtains two intersections using the selection points, the processor, operating as the extraction unit, extracts, from the two intersections, an intersection with a shorter distance to a provisional central position set as the provisional parameter of the central position, or an intersection included in a provisional central area set as the provisional parameter of the central position, as the calculated value for the central position.

7. A position detection method, comprising:
obtaining a shape;
setting a provisional parameter comprising an estimated value for a parameter associated with the shape;
extracting a plurality of detection points associated with the shape;
selecting, from the detection points, one or more combinations of selection points;
generating a plurality of hypothesis shapes based on the one or more combinations of selection points;
calculating a plurality of potential values for the parameter, each potential value of the plurality of potential values corresponding to at least one of the plurality of hypothesis shapes;
extracting, from the calculated plurality of potential values, one or more of the plurality of potential values with an error relative to the provisional parameter that fall within a predetermined range; and
determining, from the extracted one or more of the plurality of potential values, a potential value with a smallest error as a final estimated value for the parameter.

8. A non-transitory computer-readable storage medium comprising instructions that, when executed, cause a processor to perform operations comprising the position detection method according to claim 7.

9. The position detection method according to claim 7, wherein the shape comprises a captured image or a measurement value of an object.

10. The position detection method according to claim 7, wherein
determining from the extracted one or more of the plurality of potential values, the potential value with the smallest error as the final estimated value for the parameter comprises determining, from the extracted one or more of the plurality of potential values, the final estimated value for the parameter using a number of the plurality of detection points located within a predetermined distance from the shape estimated using the plurality of potential values or a sum of distances to each of the detection points from the shape estimated using the plurality of potential values.

11. The method according to claim 7, further comprising:
setting the provisional parameter using an area designated as an area including an outline of the shape, or a value or a range of values designated as an approximate value of the parameter.

12. The method according to claim 7, wherein:
when calculating a plurality of potential values for the parameter, each potential value of the plurality of potential values corresponding to at least one of the plurality of hypothesis shapes comprises calculating a plurality of potential values for the parameter using one of the hypothesis shapes,
extracting, from the calculated plurality of potential values, one or more of the calculated plurality of potential values having the error relative to the provisional parameter that falls within a predetermined range comprises extracting one of the plurality of potential values whose error relative to the provisional parameter falls within the predetermined range.

13. The method according to claim 7, wherein
the parameter is a central position of a substantially circular shape,
calculating the plurality of potential values for the parameter comprises calculating intersections of the plurality of hypothesis shapes with a predetermined radius, each having one of the selection points as a center, as at least one value for the central position, and
when calculating the plurality of potential values for the parameter returns two intersections, extracting, from the calculated plurality of potential values, one or more of the plurality of potential values having the error relative to the provisional parameter that falls within a predetermined range comprises extracting, from the two intersections, an intersection with a shorter distance to a provisional central position set as a provisional parameter of the central position, or an intersection included in a provisional central area set as the provisional parameter of the central position, as the calculated value for the central position.

* * * * *